United States Patent
Ishio

(10) Patent No.: US 7,667,336 B2
(45) Date of Patent: Feb. 23, 2010

(54) SEMICONDUCTOR DEVICE AND METHOD FOR MANUFACTURING THE SAME

(75) Inventor: Toshiya Ishio, Nabari (JP)

(73) Assignee: Sharp Kabushiki Kaisha, Osaka (JP)

( * ) Notice: Subject to any disclaimer, the term of this patent is extended or adjusted under 35 U.S.C. 154(b) by 210 days.

(21) Appl. No.: 11/889,113

(22) Filed: Aug. 9, 2007

(65) Prior Publication Data
US 2008/0036086 A1  Feb. 14, 2008

(30) Foreign Application Priority Data
Aug. 11, 2006  (JP) ............................... 2006-220563

(51) Int. Cl.
H01L 23/52 (2006.01)
H01L 23/48 (2006.01)
H01L 29/40 (2006.01)
H01L 23/485 (2006.01)
H01L 23/488 (2006.01)

(52) U.S. Cl. .................. 257/781; 257/780; 257/779; 257/E23.021; 257/E23.023

(58) Field of Classification Search ......... 257/779–781, 257/E23.021, E23.023
See application file for complete search history.

(56) References Cited

U.S. PATENT DOCUMENTS

| | | | | |
|---|---|---|---|---|
| 5,943,597 A | * | 8/1999 | Kleffner et al. | 438/613 |
| 6,337,445 B1 | * | 1/2002 | Abbott et al. | 174/260 |
| 6,417,089 B1 | * | 7/2002 | Kim et al. | 438/612 |
| 6,462,426 B1 | * | 10/2002 | Kelkar et al. | 257/781 |
| 6,489,229 B1 | * | 12/2002 | Sheridan et al. | 438/614 |
| 6,638,847 B1 | * | 10/2003 | Cheung et al. | 438/612 |
| 6,689,680 B2 | * | 2/2004 | Greer | 438/614 |
| 6,790,759 B1 | * | 9/2004 | Wang et al. | 438/612 |
| 6,959,856 B2 | * | 11/2005 | Oh et al. | 228/245 |
| 7,423,346 B2 | * | 9/2008 | Lin et al. | 257/758 |
| 2005/0258540 A1 | | 11/2005 | Minda | |
| 2006/0038291 A1 | | 2/2006 | Chung et al. | |

FOREIGN PATENT DOCUMENTS

| | | |
|---|---|---|
| JP | 8-213400 A | 8/1996 |
| JP | 11-145174 | 5/1999 |
| JP | 2005-5630 A | 1/2005 |
| JP | 2005-333007 A | 12/2005 |
| JP | 2006-19550 A | 1/2006 |
| JP | 2006-60219 A | 3/2006 |

* cited by examiner

Primary Examiner—Luan C Thai
(74) Attorney, Agent, or Firm—Nixon & Vanderhye, PC

(57) ABSTRACT

A semiconductor device provided with a semiconductor chip wherein an electrode pad is formed on a circuit formation surface, includes a first passivation film, which serves as an adhering layer; a second passivation film formed on the first passivation film, for protecting the semiconductor chip from external physical damage; a metal film formed so as to cover at least a first electrode-pad opening section of the first passivation film; and an external connection terminal to connect the electrode pad to an external equipment. A second electrode-pad opening section of the second passivation film is formed so as to expose the first electrode-pad opening section entirely. The second passivation film is formed so as not to be in direct contact with the electrode pad.

36 Claims, 7 Drawing Sheets

SEMICONDUCTOR DEVICE AND METHOD FOR MANUFACTURING THE SAME

This Nonprovisional application claims priority under 35 U.S.C. §119(a) on Patent Application No. filed in Japan on Aug. 11, 2006, the entire contents of which are hereby incorporated by reference.

FIELD OF THE TECHNOLOGY

The present technology relates to a semiconductor device and a manufacturing method thereof, and particularly, relates to a technique to prevent peeling-off and cracking of a metal film which serves as an external connection terminal.

BACKGROUND OF THE TECHNOLOGY

In recent years, electronic devices such as mobile phones and digital cameras have been drastically reduced in size and increased in processing speed. This has raised demands for smaller size or higher processing speed for components such as semiconductor devices, to be installed in electronic devices.

In a conventional semiconductor device, a semiconductor chip and a bonding wire connecting the semiconductor chip to an external equipment are covered by sealing resin, and an outer lead or the like is used to connect the semiconductor chip to the external equipment (substrates of electronic devices). With this structure, it is difficult to fully meet the demands for smaller size and higher processing speed.

In view of the foregoing circumstance, a bare chip assembly, in which a bare chip is directly mounted on a substrate, has been employed to meet the demands. In the bare chip assembly, a solder or an external connection terminal, made of gold or the like, is formed on an electrode pad of a semiconductor chip and bonded to a land formed on the substrate.

The bare chip assembly, however, has problems. Specifically, the semiconductor chip is not sufficiently protected and therefore is difficult to handle. Further, the external connection terminal easily cracks due to change in temperature in the environment. These problems occur owning to the following reasons. An outer lead having spring effect is not employed as the external connection terminal. Thus, owning to the difference in coefficient of linear expansion between a substrate and a semiconductor chip, stress is concentrated on a section connecting the external connection terminal, which section is in between the substrate and the semiconductor chip.

Japanese Unexamined Patent Publication No. 145174/1999 (Tokukaihei 11-145174) (published on May 28, 1999) suggests means for solving the problem of breakage of an external connection terminal due to stress concentration. Concretely, the publication suggests a semiconductor device including an atom mixed layer, and a method for manufacturing the semiconductor device.

The following describes the semiconductor device of publication No. 145174/1999, with reference to FIG. 14. The semiconductor device is manufactured by use of the bare chip assembly. FIG. 14 is an enlarged view showing the vicinity of the external connection terminal of the semiconductor device. As shown in FIG. 14, a passivation film 103 made of SiN is formed on a surface of the semiconductor chip 100, on which surface a semiconductor element is to be mounted. The passivation film 103 has an opening section over an electrode pad 102. On the passive film 103, a polyimide film 104 is formed to protect the electronic pad, etc., against external damage. The polyimide film 104 has an opening section inside of the opening section 103a of the passivation film 103.

Further, the following films are layered to form a base metal layer of the bump: a Cr sputtered film (0.1 μm), which adheres well to the electrode pad 102; a Cu sputtered film (0.1 μm), which is an external connection terminal 131 and adheres well to a Sn—Pb solder bump; and a Au sputtered film (1 μm), which is an oxidization preventing film. Publication No. 145174/1999 proposes the method for preventing the cracking and peeling-off problems when adopting Pb—Sn alloy, which is a common solder material.

Specifically, after the Cu sputtered film is formed, or after the Au sputtered film is formed, Ar+ ions are applied to form the atom mixed layer of approximately 0.05 μm in between the Cr film and the Cu film.

Publication No. 145174/1999 reported a result of a high-temperature storage test performed at 150° C. on the semiconductor device having the atom mixed layer. According to the result of the test, cracking and peeling-off problems were not observed. Specifically, Sn contained in the solder that is the external connection terminal 131 becomes alloyed with Cu contained in the Cu film, so that a non-reacted part of the Cu film disappears. Thus, a Pb precipitate grown widely occupies an interface between the Sn—Cu alloy layer and the Cr film. However, the atom mixed layer adheres well to the Pb precipitate. Therefore, there is no problem of cracking and peeling-off.

With this conventional structure, however, the polyimide film 104 is formed on the electrode pad metal 102, whose adhesive force is not sufficiently large, and the metal film which serves as the external connection terminal is formed in this area. Further, the metal film, except for the section bonded to the electrode pad metal 102, is formed so as to adhere only to the polyimide film 104, whose adhesive force is not sufficiently strong. Thus, the method of providing the atom mixed layer as suggested in the above Publication not sufficient to prevent the problems of peeling-off and cracking of the metal film constituting the external connection terminal and the interface of the metal film due to the stress concentrated on the metal film which serves as an external connection terminal and the interface of the metal film.

SUMMARY OF THE TECHNOLOGY

An object of the present technology is therefore to provide a semiconductor device having desirable electric characteristics, which is assembled by bare chip assembly, and which realizes an improved adhesive force between a metal film constituting an external connection terminal and an interface of the metal film and prevents the peeling-off and cracking problems.

To solve the foregoing problems, a semiconductor device provided with a semiconductor chip wherein an electrode pad is formed on a circuit formation surface, includes: a first passivation film, which serves as an adhesive layer, formed on the circuit formation surface, with a first electrode-pad opening section from which the electrode pad is to be exposed; a second passivation film, which protects the semiconductor chip from external physical damage, formed on the first passivation film with a second electrode-pad opening section from which the electrode pad is to be exposed; and an external connection terminal which connects the electrode pad to an external equipment, the external connection terminal including a metal film formed so as to cover at least the first electrode-pad opening section, the second electrode-pad opening section being formed so as to expose the first electrode-pad opening section entirely, and the second passivation film being provided so as not to be in direct contact with the electrode pad.

With this structure, the second electrode-pad opening section of the second passivation film is formed to expose the first electrode-pad opening section entirely. Thus, the second passivation film, which has small adhesive force, is not in direct contact with the electrode pad.

Therefore, an upper layer of the electrode pad is stabilized, and the metal film constituting the external connection terminal can be connected to the electrode pad under more stable conditions.

Thus, peeling-off and cracking at the interface between the metal film and the electrode pad are reduced, and a semiconductor device having suitable electric characteristics is realized.

In the semiconductor device, a periphery of the second electrode-pad opening section may substantially coincide with a periphery of the first electrode-pad opening section.

Further, the second electrode-pad opening section may be formed larger than the first electrode-pad opening section so that a periphery of the second electrode-pad opening section is outside of a periphery of the first electrode-pad opening section, and a part of the metal film may adhere to the first passivation film in an area where the second electrode-pad opening section is formed.

With this structure, the second electrode-pad opening section is formed larger than the first electrode-pad opening section. Therefore, no second passivation film exists on the first passivation film in an area where the second electrode-pad opening section is formed. In this area, a part of the metal film constituting the external connection terminal also adheres to the first passivation film, which has large adhesive force and connection force.

In other words, the metal film adheres to the first passivation film, which has large connection force, also via a section (section around the electrode pad) other than a section bonded to the electrode pad. Thus, physical connection between the metal film and the electrode pad becomes more stable. Further, moisture is prevented from entering a device section of the semiconductor chip via the electrode pad.

Therefore, peeling-off and cracking at the interface between the metal film and the electrode pad is prevented more effectively, and a semiconductor device having suitable electric characteristics is realized.

The metal film may include, at least at a part of a periphery of the electrode pad, an adhesion section adhering to the first passivation film. The second passivation film may be formed so as to cover a part of a periphery of the electrode pad.

The metal film may have, along an entire periphery of the electrode pad, an adhesion section adhering to the first passivation film. The second passivation film may be formed so as to cover a part of the periphery of the electrode pad.

Further, it is preferable that the second electrode-pad opening section be formed so as to surround the periphery of the electrode pad.

With this structure, the metal film has sections adhering to the first passivation film, along the entire periphery of the electrode pad. Thus, physical connection between the metal film and the electrode pad becomes more stable. Further, moisture is prevented from entering a device section of the semiconductor chip via the electrode pad.

Further, forming the second electrode-pad opening section so as to surround the electrode pad allows the semiconductor chip to be protected from external physical damage more effectively.

Thus, peeling-off and cracking at the interface between the metal film and the electrode pad are prevented more effectively, and a semiconductor device having suitable electric characteristics is realized.

Further, it is preferable in the semiconductor device that the first passivation film be made of a material that is lower in absorption rate than the second passivation film.

With this structure, the first passivation film is made of a material having a lower absorption rate than that of the second passivation film. Thus, moisture absorption by the first passivation film having the sections adhering to the metal film is prevented, compared with conventional cases. Therefore, peeling-off of the metal film due to moisture absorption by the first passivation film can be suppressed. Further, the problems of peeling-off or cracking the metal film due to change in volume resulting from absorption and discharge of moisture by the first passivation film can be suppressed.

Further, it is preferable in the semiconductor device that the first passivation film be made of a material having a smaller coefficient of linear expansion than the second passivation film.

With this structure, the first passivation film is made of a material having a smaller coefficient of linear expansion than that of the second passivation film. Thus, change in volume of the first passivation film due to thermal change is prevented, compared with the conventional cases. Therefore, peeling-off and cracking of the metal film due to change in volume of the first passivation film is prevented.

Further, it is preferable in the semiconductor device that the first passivation film be made of an inorganic material, and the second passivation film be made of an organic material.

With this structure, the metal film is adhered to the first passivation film which is made of an inorganic material and is high in degree of adhesion. Further, the semiconductor chip is assuredly protected from external physical damage by the second passivation film, which is made of an organic material, is excellent in elasticity and chemical resistance, and suitably demonstrates the function of protection.

Further, it is preferable in the semiconductor device that a cross section (surface vertical to the wafer surface) of the metal film along a laminate orientation be formed in such a manner that each corner section is rounded.

With this structure, each corner section of the polygonal shape of the cross section of the metal film in the laminate orientation is formed in round shape, which polygonal shape is formed by the differences in level among or between the electrode pad, the first passivation film, and the second passivation film. Thus, the cross section of the interface with a bonding material, such as solder, utilized in mounting does not form a straight line along the laminate orientation. Therefore, peeling-off and cracking at the surface of the metal film are less likely to be caused. Even if peeling-off and cracking occur, further peeling-off and cracking are prevented. Further, in a case in which electrical connection is to be made by bringing metal particles such as an anisotropic conductive film (ACF) into contact, short-circuit between adjacent external connection terminals bonded at a narrow pitch by ACF is prevented.

Further, in a case in which solder paste is applied to the substrate to connect via solder, or in a case in which a bump is formed on the metal film with the use of a metal having a low melting point (low melting temperature), such as Sn-group solder especially lead-free solder, stress concentrates on an external connection terminal section resulting from change in operating environmental temperature due to the difference in coefficient of linear expansion from the substrate. Stress concentrates especially on the interface via which the external connection terminal is bonded, and on the corner sections such as a peripheral section.

On the other hand, with the structure, each corner section of the cross section of the metal film in the laminate orientation is formed so as to be rounded. Thus, stress is dispersed all over the metal film. Further, the cross section of the interface between the bonding materials, such as solder, and the metal film does not form a straight line along the laminate orientation. Thus, cracking along the interface between the solder, which prevents cracks from spreading, and the metal film is prevented.

Further, it is preferable in the semiconductor device that the metal film be a laminate of plural layers including a first layer, which is an uppermost layer, and a second layer, which is provided directly below the uppermost layer, the first layer and the second layer be made of a same metal or a material containing, as a main component, a same metal, and the metal of the first layer be coarser in structure than the metal of the second layer.

With this structure, a metal that is coarser in structure than the second layer is utilized in the first layer, which is the uppermost layer. Thus, for example it is easy to round each corner of the cross section along the laminate orientation. Further, with the structure, especially the main component of the first layer, which is the uppermost layer, and the main component of the second layer, which is the base metal layer, are the same metal. Thus, eliminating the metal of the second layer and rounding the cross section of the metal of the first layer, which is the uppermost layer, can be carried out concurrently.

It is preferable that the plural layers further include a third layer being a lowermost layer and a barrier layer, and the first layer be made of Cu and has a thickness of 2 μm or greater.

The total thickness of the first layer made of Cu and the second layer is important in connecting to Sn-group solder material. With the foregoing structure, a diffusion layer between Cu and Sn does not reach the third layer, which is a barrier layer, during thermal treatment in mounting the substrate and other components. Thus, when the semiconductor device is used at room temperature, and the temperature of the semiconductor chip does not rise so much, the problems of peeling-off or cracking the metal film can be suppressed.

Further, it is preferable that the external connection terminal include a bump formed on the metal film and having at least a coating constituted of a conductive bonding member and a core section made of resin or metal, and the core section do not melt at a melting temperature of the coating.

If the core of the bump is not made of metal or resin that does not melt at the melting temperature of the metal coating, it becomes possible to have a higher amount of space with the components to be mounted than the case of a metal ball made solely of solder. Thus, stress on the metal film, which is the external connection terminal, due to thermal change in operating environment or the like resulting from the difference in coefficient of linear expansion from the components (e.g. substrate) is dispersed. Further, if the core contains resin that changes in shape elastically, the shape of the core changes elastically. This, in addition to the stress dispersion effect produced by the higher amount of space, allows stress on the metal film to be dispersed. Thus, the metal film is prevented from peeling off and cracking more effectively.

Further, it is preferable in the semiconductor device that the external connection terminal include a bump formed on the metal film and containing a Pb-free solder material.

With this structure, precipitation of Pb at the interface between the third layer (barrier layer) and the bump is prevented. Thus, the problems of peeling off or cracking at the interface with the barrier layer can be suppressed.

It is preferable in the foregoing structure that a rounded surface of the metal film be covered by a bump material.

With this structure, the bump material is formed on a round face. Therefore, a connection interface does not form a straight line. Thus, physical connection between the metal film and the electrode pad becomes more stable.

Further, it is preferable in the semiconductor device that a side surface of the metal film be covered by a bump material.

With this structure, the bump material also covers the side surface of the metal film. Thus, physical connection between the bump material and the metal film becomes more stable. Further, the metal film is prevented from being further oxidized at the side surface. Thus, the problems of cracking the metal film can be more effectively suppressed.

Further, it is preferable in the semiconductor device that a side surface of the second electrode-pad opening section, over which the metal film is to be provided, incline outwardly from a rear surface toward a front surface to form a curved surface contiguous to the front surface of the second passivation film.

With this structure, the side surface of the second electrode-pad opening section forms the curved surface contiguous to the surface of the second passivation film. Thus, coverage of the metal film becomes fine, compared with the case in which the side surface of the second electrode-pad opening section is provided vertically to the surface of the second passivation film. Therefore, a lamination state of the metal film is stabilized. Thus, the problems of peeling-off and cracking of the metal film can be more effectively suppressed. Further, moisture is prevented from entering via the metal film. Thus, the metal film is prevented effectively from peeling off at the section that is in contact with the second passivation film.

Further, stress is prevented from concentrating on the sections of different levels of the interface with the metal film due to change in shape of the second passivation film resulting from change in temperature or absorption of moisture (stress is dispersed). Thus, the metal film is prevented from peeling off and cracking more effectively.

Further, it is preferable that a side surface of the second electrode-pad opening section, over which the metal film is to be provided, incline outwardly from a rear surface of the second passivation film toward a front surface of the second passivation film to form a curved surface contiguous to an adhesion surface of the first passivation film, which adhesion surface adheres to the metal film.

With this structure, the metal film is suitably covered. Thus, the lamination state of the metal film becomes stable. Further, the contiguous curved surface is formed so that concentration of stress is avoided. Thus, the metal film is prevented from peeling off and cracking.

Further, moisture is prevented from entering via the metal film. Thus, the metal film is prevented effectively from peeling off at the section that is in contact with the second passivation film.

Further, stress is prevented from concentrating on the sections of different levels of the interface with the metal film due to change in shape of the second passivation film resulting from change in temperature or absorption of moisture (stress is dispersed). Thus, the metal film is prevented from peeling off and cracking more effectively.

It is preferable that a cross section of the second electrode-pad opening section along a surface orientation (surface orientation horizontal to the wafer surface) be one of ellipse-shaped, round-shaped, and polygon-shaped having each corner section being rounded.

Further, in the structure in which the second passivation film is formed so as to cover a part of the periphery of the electrode pad, it is preferable that a cross section of the second electrode-pad opening section along a surface orientation has a partial elliptical shape, a partial round shape, a partial polygon shape in which each corner section is rounded.

With this structure, each corner section of the metal film is covered more suitably than, for example, in the case in which the cross section of the second electrode-pad opening section is quadrilateral. Thus, the lamination state of the metal film becomes stable, which in turn suppresses the problems of peeling-off or cracking the metal film. Further, moisture is prevented from entering via the metal film. Thus, the metal film is prevented effectively from peeling off at the section that is in contact with the second passivation film.

Further, stress is prevented from concentrating on the sections of different levels of the interface with the metal film due to change in shape of the second passivation film resulting from change in temperature or absorption of moisture (stress is dispersed). Thus, the metal film is prevented from peeling off and cracking more effectively.

Further, it is preferable that a side surface of the first electrode-pad opening section, over which the metal film is to be provided, incline outwardly from a rear surface of the first passivation film toward a front surface of the first passivation film.

With this structure, each corner section of the metal film is covered more suitably than the case in which a side surface of the first electrode-pad opening section in which the metal film is to be formed is formed vertically to a planar orientation. Thus, the lamination state of the metal film becomes more stable, which in turn suppresses the problems of peeling-off or cracking the metal film. Further, moisture is prevented from entering via the metal film. Thus, the first passivation film can be adhered to the metal film under more stable conditions.

Further, stress is prevented from concentrating on the sections of different levels of the interface with the metal film due to change in shape of the first passivation film resulting from change in temperature or absorption of moisture (stress is dispersed). Thus, the metal film is prevented from peeling off and cracking more effectively.

It is preferable that a side surface of the first electrode-pad opening section form a curved surface contiguous to a front surface of the first passivation film.

With this structure, the side surface of the first electrode-pad opening section forms a curved surface contiguous to the surface of the first passivation film. Thus, compared with a case in which the side surface of the first electrode-pad opening section is formed vertically to the front surface of the first electrode-pad opening section, coverage of the metal film becomes finer, and a lamination state of the metal film is stabilized. Further, the contiguous curved surface is formed so that concentration of stress is avoided. Thus, the metal film is prevented from peeling off and cracking. Further, moisture is prevented from entering via the metal film. Thus, the first passivation film can be adhered to the metal film under more stable conditions.

Further, stress is prevented from concentrating on the sections of different levels of the interface with the metal film due to change in shape of the first passivation film resulting from change in temperature or absorption of moisture (stress is dispersed). Thus, the metal film is prevented from peeling off and cracking more effectively.

It is preferable that a side surface of the first electrode-pad opening section form a curved surface contiguous to an adhesion surface of the electrode pad, which adhesion surface adheres to the metal film.

With this structure, coverage of the metal film becomes fine, compared with the case in which the side surface of the first electrode-pad opening section is formed vertically to the surface of the electrode pad, which surface adheres to the metal film. Further, the contiguous curved surface is formed so that concentration of stress is avoided. Thus, the metal film is prevented from peeling off and cracking.

Further, moisture is prevented from entering via the metal film. Thus, the first passivation film can be adhered to the metal film under more stable conditions.

Further, stress is prevented from concentrating on the sections of different levels of the interface with the metal film due to change in shape of the first passivation film resulting from change in temperature or absorption of moisture (stress is dispersed). Thus, the metal film is prevented from peeling off and cracking more effectively.

It is preferable that a cross section of the first electrode-pad opening section along a surface orientation (surface orientation horizontal to the wafer surface) be one of ellipse-shaped, round-shaped, and polygon-shaped having each corner section being rounded.

With this structure, coverage at the respective corner sections of the metal film become finer, compared with a case in which, for example, the first electrode-pad opening section has a quadrangular cross section. Thus, a lamination state of the metal film is stabilized, which in turn suppresses the problems of peeling-off or cracking of the metal film.

In the semiconductor device, the second electrode-pad opening section may be formed substantially at the center of the metal film.

With this structure, for example in a case in which the bump constituting the external connection terminal is formed by a ball mounting method, the bump is formed in the central part of the metal film without causing a problem that the metal ball to be mounted moves toward an end of the metal film. Thus, the problems of peeling-off or cracking at the interface between the metal film and the bump due to poor connection can be suppressed.

Further, in the semiconductor device, a center of the first electrode-pad opening section may be positioned so as to deviate from a center of the metal film.

With this structure, the second passivation film is formed so as to avoid direct contact with the electrode pad. Thus, even if a part of the metal film around the electrode pad does not adhere to the first passivation film, the effect of preventing the metal film from peeling off increases, compared with conventional structures.

Further, with this structure, an externally connected section of the metal film, such as a bump, is provided so as to deviate from a section bonded to the electrode pad. This allows the area of the metal film to be larger. Thus, when connecting to the external equipment, for example, when mounting on a substrate, stress applied to the metal film is dispersed all over the metal film, thereby realizing an improved effect of preventing the metal film from peeling off and cracking.

Further, with this structure, the degree of freedom increases in degree of freedom in positioning the electrode pad. This is suitable for a case in which the external connection terminal is limited in position, for example.

Further, it is preferable in the above structure that the metal film, except for a section connected to an external equipment, be covered by a third passivation film.

With this structure, the section bonded to a substrate, such as solder material, is prevented from flowing on the metal film, and connection of a desired shape is obtained. Further, sections of the metal film, except for the sections connected to the external equipment, are protected by the third passivation film. Thus, corrosion such as oxidization of the metal film is prevented, and peeling-off and cracking of the metal film can be suppressed.

To solve the foregoing problems, a method for manufacturing a semiconductor device provided with a semiconductor chip wherein an electrode pad is formed on a circuit formation surface includes the steps of forming, on the circuit formation surface, a first passivation film, which serves as an adhesive layer, with a first electrode-pad opening section from which the electrode pad is to be exposed; forming, on the first passivation film, a second passivation film, which protects the semiconductor chip from external physical damage, with a second electrode-pad opening section from which the electrode pad is to be exposed; and forming an external connection terminal which connects the electrode pad to an external equipment, the external connection terminal including a metal film formed so as to cover at least the first electrode-pad opening section, the second electrode-pad opening section being formed so as to expose the first electrode-pad opening section entirely, and the second passivation film being provided so as not to be in direct contact with the electrode pad.

With this method, the second electrode-pad opening section of the second passivation film is formed in such a manner that the first electrode-pad opening section is entirely exposed. Therefore, the second passivation film, which has small adhesive force, is not in direct contact with the electrode pad.

Thus, an upper layer of the electrode pad is stabilized, and adhesion between the metal film constituting the external connection terminal and the electrode pad improves.

Therefore, peeling-off and cracking at the interface between the metal film and the electrode pad is prevented, and a semiconductor device having suitable electric characteristics is realized.

In the method for manufacturing the semiconductor device, a periphery of the second electrode-pad opening section may be formed so as to substantially coincide, along an orientation of the circuit formation surface, with a periphery of the first electrode-pad opening section.

It is preferable in the method for manufacturing the semiconductor device that the first electrode-pad opening section and the second electrode-pad opening section be formed concurrently.

With this method, the first electrode-pad opening section and the second electrode-pad opening section are formed at the same time. This simplifies the manufacturing process.

Further, it is preferable that the method of manufacturing the semiconductor device include: exposing a part of the first passivation film from the second electrode-pad opening section; and adhering the first passivation film to the metal film, the first passivation film being exposed from the second electrode-pad opening section.

With this method, the metal film also adheres to the first passivation film, which has high connection force, in an area (area around the electrode pad) other than a connection section between the electrode pad and the metal film. Thus, physical connection between the metal film and the electrode pad becomes more stable. Further, moisture is prevented from entering a device section of the semiconductor chip via the electrode pad.

Therefore, peeling-off and cracking at the interface between the metal film and the electrode pad is prevented more effectively, and a semiconductor device having suitable electric characteristics is realized.

The method of manufacturing the semiconductor device may include forming photoresist so as to expose a base metal layer formed over the second electrode-pad opening section and on a part of an upper layer of the second passivation film.

It is preferable that the method include forming photoresist so as to expose a base metal layer formed over the second electrode-pad opening section and on the second passivation film surrounding the second electrode-pad opening section.

With this method, the metal film is formed so as to cover the second electrode-pad opening section and the second passivation film formed around the second electrode-pad opening section.

In other words, the metal film, which protects the semiconductor chip from physical damage more effectively than the second passivation film does, is formed so as to cover the second passivation film. If the second passivation film were formed so as to coincide with a boundary of the metal film, there would arise an area covered neither of the second passivation film and the metal film in relation to accuracy, resulting from excess and shortage in exposure and development. In this case, careful handing is required in testing, conveyance, and mounting, in the same manner as to the semiconductor chips.

On the contrary, with the arrangement above, the metal film is formed so as to cover the second passivation film completely. This facilitates handing the semiconductor device.

It is preferable that that the method include rounding a peripheral section, along a laminate orientation, of the uppermost layer of the metal film.

With this method, the cross section of the interface with the bonding materials, such as solder, utilized in mounting does not form a straight line along the laminate orientation. Therefore, peeling-off and cracking at the surface of the metal film are less likely to be caused. Even if peeling-off and cracking occur, further peeling-off and cracking are prevented. Further, in a case in which electrical connection is to be made by bringing metal particles such as ACF into contact, short-circuit between adjacent terminals.

It is preferable to round the uppermost layer by etching a peripheral section, in a cross-section orientation, of the uppermost layer of the metal film and the base metal layer concurrently.

With this method, the manufacturing process is simplified.

It is preferable that the method further include the steps of forming a bump by applying bump material in paste form so as to cover a front surface of the metal film and a rounded surface around the front surface of the metal film, and subsequently carrying out thermal treatment.

Further, it is preferable that the method include forming a bump by applying bump material in paste form so as to cover a side surface of the metal film, and subsequently carrying out thermal treatment.

With this method, the bump material is applied so as to cover the front surface of the metal film and rounded surfaces around the front surface, or applied so as to cover the side surface of the metal film. Thus, physical connection between the bump material and the metal film becomes more stable. Further, the bump material is applied so as to cover the side surface of the metal film. Thus, the metal film is prevented from being further oxidized at the side surface. Therefore, cracking of the metal film can be suppressed.

It is preferable that the method include forming a bump on the metal film by applying flux so as to cover a front surface of the metal film and a rounded surface around the front surface of the metal film, mounting a metal ball, and subsequently carrying out thermal treatment.

Further, it is preferable that the method include forming a bump on the metal film by applying flux so as to cover a front surface of the metal film and a side surface of the metal film, mounting a metal ball, and subsequently carrying out thermal treatment.

With this method, flux is applied so as to cover the front surface of the metal film and rounded surfaces around the front surface, or applied so as to cover the front surface of the metal film and the side surface of the metal film. Thus, physical connection between the bump material and the metal film becomes more stable. Further, flux is applied so as to cover the side surface of the metal film, whereby the bump material is formed on the side surface of the metal film. Thus, the metal film is prevented from being oxidized at the side surface. Therefore, the problems of peeling-off or cracking the metal film can be suppressed.

It is preferable that the method include forming a bump on the metal film by applying solder material in paste form so as to cover a front surface of the metal film and a rounded surface around the front surface of the metal film, mounting a metal ball, and subsequently carrying out thermal treatment.

Further, it is preferable that the method include forming a bump on the metal film by applying solder material in paste form so as to cover a front surface of the metal film and a side surface of the metal film, mounting a metal ball, and subsequently carrying out thermal treatment.

With this method, the metal ball is mounted by applying the bump material in paste form so as to cover the front surface of the metal film and rounded surfaces around the front surface, or by applying the solder material in paste form so as to cover the front surface of the metal film and the side surface of the metal film. Thus, physical connection between the bump material and the metal film becomes more stable. Therefore, the problem of cracking the metal film can be suppressed. Further, the solder material in paste form is applied so as to cover the side surface of the metal film, and subsequently the metal ball is mounted. Thus, the metal film is prevented from being further oxidized at the side surface. Therefore, the problems of cracking the metal film is less likely to occur.

Further, the bump can be formed high, compared with the cases in which solder material in paste form or a metal ball is utilized solely. Thus, a semiconductor device is produced, by which stress on the metal film, which is the external connection terminal, and on a section where the bump is formed is dispersed.

It is preferable that a core of the metal ball be made of one of a metal and a resin, neither of which melts at a melting temperature of a metal coating.

If the core of the metal ball is not made of metal or resin that does not melt at the melting temperature of the metal coating, it becomes possible to have a higher amount of space with the components to be mounted than the case of a metal ball made solely of solder. Thus, stress on the metal film, which is the external connection terminal, due to thermal change in operating environment or the like resulting from the difference in coefficient of linear expansion from the components (e.g. substrate) is dispersed. Further, if the core contains resin that changes in shape elastically, the shape of the core changes elastically. This, in addition to the stress dispersion effect produced by the higher amount of space, allows stress on the metal film to be dispersed. Thus, the metal film is prevented from peeling off and cracking more effectively.

Additional objects, features, and strengths of the present technology will be made clear by the description below. Further, the advantages will be evident from the following explanation in reference to the drawings.

DESCRIPTION OF THE EMBODIMENTS

Best Mode for Carrying Out the Technology

A semiconductor device in accordance with the present embodiment including a semiconductor chip is to be mounted on (connected to) a substrate of an electronic device. Further, the semiconductor device includes a bump, which serves as an external connection terminal, formed on a surface of the semiconductor chip, where a semiconductor element is to be mounted. The semiconductor device is designed to be flip-chip connected to the substrate of the electronic device.

Embodiment 1

The following describes an embodiment with reference to FIGS. 1 to 8, 10, and 11.

Figure 1:
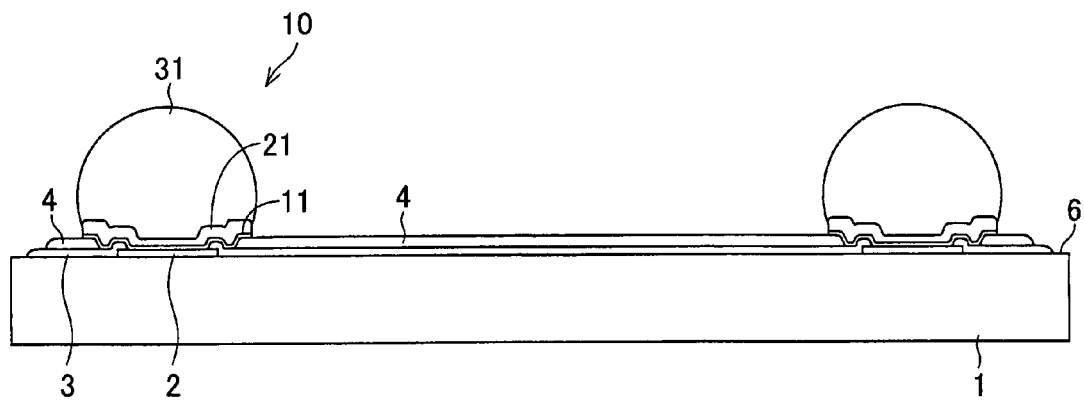
FIG. 1 is a sectional view showing a structure of a semiconductor device.

As shown in FIG. 1, a semiconductor chip 1, which constitutes a semiconductor device of the present embodiment, includes an electrode pad metal (electrode pad) 2, a first passivation film 3, a second passivation film 4, a metal film (external connection terminal) 11, a metal film (external connection terminal) 21, and a bump (external connection terminal, solder connection area) 31.

The electrode pad metal 2 is to realize an electrical connection between the semiconductor chip 10 and other components.

The first passivation film 3 is made of a nitride film, and has functions of causing the metal films 11 and 21 to adhere and protecting the semiconductor chip 1 mainly from chemical damage. The first passivation film 3 has opening sections (first electrode-pad opening section, first scribing line opening section) inside of the electrode pad metal 2 (e.g. Al group metal, Cu group metal) and in a scribe area 6. The scribe area 6 is provided as a cutting margin for dicing the wafer.

The material of the first passivation film 3 is not limited to a nitride film, which is an inorganic material, but it is preferable to use a material of relatively low absorption rate or small coefficient of linear expansion. This is effective for ensuring adhesion between the metal film 11 and the metal film 21 constituting an external connection terminal, which will be described later, and protecting a semiconductor element (not shown) of the semiconductor chip 1 by blocking the moisture.

Some organic materials such as polyimide and polybenzoxazole (PBO) have relatively low absorption rate and small coefficients of linear expansion. However, for the first passivation film 3, a film of an inorganic material of low absorption rate and small coefficient of linear expansion are preferable.

The second passivation film 4 is made of polyimide, which is an organic material. The second passivation film 4 serves as sealing resin that protects the semiconductor chip 1 mainly from external physical damage to make the semiconductor device easy to handle. The second passivation film 4 includes opening sections (second electrode-pad opening section, second scribing line opening section) outside of the electrode pad metal 2 and in the scribe area 6.

For the material of the second passivation film 4, other organic materials than polyimide, such as PBO and epoxy, or inorganic materials such as oxide films and nitride films, may be adopted. However, the organic materials are preferable because of their beneficial features, such as high elasticity (shock-resistance), chemical resistance, which provide suitable protection. The organic materials are advantageous in that it is easy to increase a film thickness.

In the present embodiment, polyimide is employed between polyimide and polybenzoxazole (PBO), both of which are excellent especially in elasticity (shock-resistance) and chemical resistance among organic materials.

Further, it is preferable that the first passivation film 3 be made of a material having a lower absorption rate than that of the second passivation film 4.

With this structure, the first passivation film 3 is made of a material having a lower absorption rate than that of the second passivation film 4. Thus, the first passivation film 3 having an area adhered to the metal film 11 can be prevented from absorbing moisture, as compared to the conventional structure. As a result, the problems of peeling-off the metal films 11 and 21 due to moisture absorption by the first passivation film 3 can be suppressed. Further, the problems of peeling-off or cracking the metal film 11 and 21 due to change in volume resulting from absorption and discharge of moisture by the first passivation film 3 are less likely to occur.

Further, it is preferable that the first passivation film 3 be made of a material having a smaller coefficient of linear expansion than that of the second passivation film 4.

With this structure, the first passivation film is made of a material having a smaller coefficient of linear expansion than that of the second passivation film 4. Thus, change in volume of the first passivation film, on which the metal films 11 and 21 are to be formed, due to thermal change is prevented, compared with conventional cases. Therefore, peeling-off and cracking of the metal films 11 and 21 due to change in volume of the first passivation film 3 is prevented.

Further, the organic materials, such as polyimide, to be utilized as the second passivation film 4 do not exhibit sufficient adhesive force to Al group metals and Cu group metals. For this reason, in the present embodiment, the second electrode-pad opening section 4a exposes the first electrode-pad opening section 3a entirely so that the second passivation film 4, which is a polyimide film, is not in direct contact with the electrode pad 2.

Concretely, a second electrode-pad opening section 4a, which is an opening section of the second passivation film 4, is formed wider than the first electrode-pad opening section 3a so that the second electrode-pad opening section 4a comes outside of the first electrode-pad opening section 3a, which is an opening section of the first passivation film 3. A part of the metal film 11 and a part of the metal film 21 adhere to the first passivation film 3 in the second electrode-pad opening section 4a.

The present technology, however, is not limited to the foregoing structure. For example, a periphery of the second electrode-pad opening section 4a may substantially coincide with the first electrode-pad opening section 3a in the direction of the circuit formation surface, in the manner as described in Embodiment 2.

Figure 4:
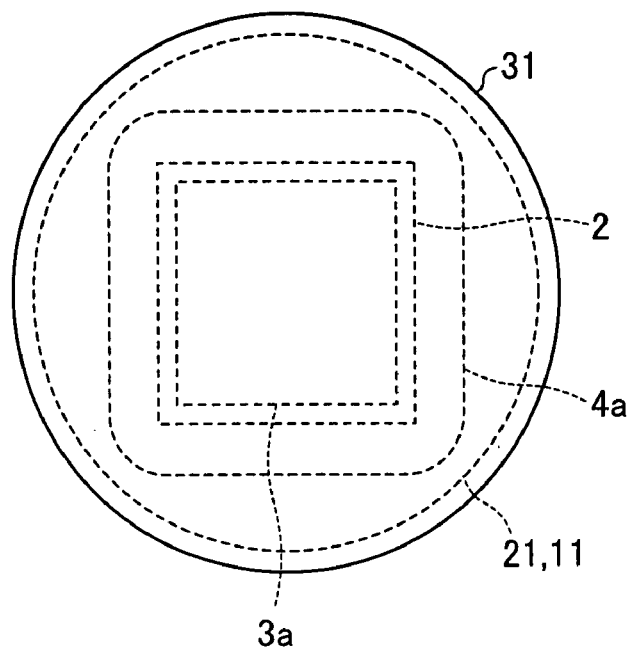
FIG. 4 is a plan view showing a structure of an external connection terminal section of the semiconductor device shown in FIG. 3.

Further, it is preferable that the second electrode-pad opening section 4a be larger in size than the electrode pad metal 2, as shown in FIG. 4.

The second electrode-pad opening section 4a is formed wider than the electrode pad metal 2 so that it becomes possible to form a large external connection terminal.

If the external connection terminal is small, stress is applied in a concentrated manner to the external connection terminal resulting from change in operating temperature of the semiconductor device, due to the difference in coefficient of linear expansion between the semiconductor substrate 1 and the semiconductor device. This may cause rupture at the section bonded to the external connection terminal.

In contrast, with the foregoing structure, a large external connection terminal is formed so that rupture due to concentrated stress is prevented in the section bonded to the external connection terminal.

Figure 3:
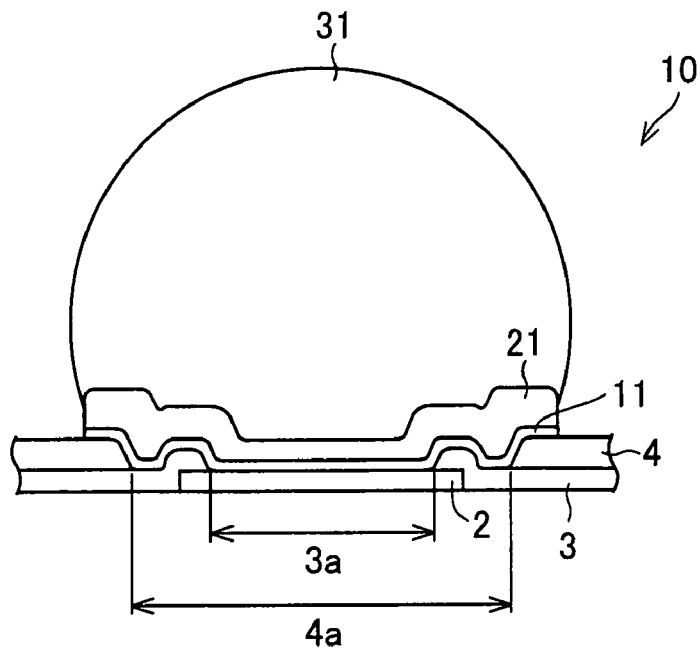
FIG. 3 is a sectional view showing a structure of an external connection terminal section of the semiconductor device shown in FIG. 1.

Further, it is preferable in view of adhesion to the base of the first passivation film 3 that the second passivation film 4 be formed in such a way as to avoid the first passivation film 3 formed on the electrode pad metal 2, as shown in FIG. 3.

The reason therefor is that frequently the second passivation film 4 peels off together with the first passivation film 3 due to stress applied to the external connection terminal.

In the present embodiment, the second electrode-pad opening section 4a is larger in size than the electrode pad metal 2, the circumference thereof is positioned outside the first electrode-pad opening section 3a, and is formed so as to surround the periphery of the electrode pad metal 2, as shown in FIGS. 3 and 4. The first electrode-pad opening section 3a is formed substantially at the center of the second electrode-pad opening section 4a.

The metal film 21 and the metal film 11, both of which constitute the external connection terminal, are formed so as to cover the first electrode-pad opening section 3a.

That is to say, in the present embodiment, the metal film 11 has a section adhering to the first passivation film 3 formed so as to surround the first electrode-pad opening section 3a.

With this structure, the second electrode-pad opening section 4a is formed greater than the first electrode-pad opening section 3a. Therefore, no second passivation film 4 exists on the first passivation film 3 in the area of the second electrode-pad opening section 4a. In the area of the second electrode-pad opening section 4a, a part of the metal film 11, which constitutes the external connection terminal, also adheres to the first passivation film 3, which has large adhesive force and connection force.

In other words, the metal film 11 adheres to the first passivation film 3, which has large connection force, also via a section (section around the electrode pad) other than the section bonded to the electrode pad metal 2. Thus, physical connection between the metal film 11 and the electrode pad metal 2 becomes more stable. Further, moisture is prevented from entering a device section of the semiconductor chip 1 via the electrode pad metal 2.

Thus, peeling-off or cracking at the interface between the metal film 11 and the electrode pad metal 2 can be suppressed effectively. Therefore, a semiconductor device having suitable electric characteristics is realized.

A metal ball is formed on the metal film 21. The metal ball is made of a metal having a low melting point (low melting temperature), such as Sn-group solder, especially a lead-free solder, or the metal ball contains, in its core, either resin and other metal, such as a metal having a high melting point, or resin. The metal ball is thermally treated in a reflow oven or the like, whereby an external connection terminal having a bump 31 is formed.

In the external connection terminal of the present embodiment, the bump 31 is formed on the metal film 21. The bump 31 includes a core section that is constituted of at least resin or metal, and a coating made of a conductive bonding member. The core section is arranged so as not to melt at the melting temperature of the coating.

If the core of the metal ball is made of a metal or a resin, neither of which melts at the melting temperature of the metal coating as described above, it becomes possible to have a higher amount of space with the components to be mounted than the case of a metal ball made solely of solder. Thus, stress on the metal film, which is the external connection terminal, due to thermal change in operating environment or the like resulting from the difference in coefficient of linear expansion from the components (e.g. substrate) is dispersed. Further, if the core contains resin that changes in shape elastically, the shape of the core changes elastically. This, in addition to the stress dispersion effect produced by the higher amount of space, allows stress on the metal film to be dispersed. Thus, the problems of peeling-off or cracking of the metal film can be prevented more effectively.

It is preferable that the second passivation film 4 be formed in such a manner that the center of the second electrode-pad opening section 4a comes substantially at the centers of the metal film 21 and the metal film 11, as shown in FIG. 4.

This allows the bump 31 to be formed at the central section of the metal films 21 and 11 without causing a problem that a metal ball, which constitutes the bump 31, rolls toward the ends of the metal films 21 and 11.

The metal ball having the core contains a lower volume of solder than a metal ball made solely of solder. This is especially effective because the characteristic of self-alignment (moves to the center of the connecting section as a result of thermal treatment) is inferior. Thus, the problems of peeling-off or cracking at the interface between the bump 31 and the metal films 21 and 11 due to poor connection are less likely to occur.

Further, sections of the first passivation film 3 and the second passivation film 4, which sections are covered by the metal film 11, are arranged as follows. Side walls of the opening sections 3a and 4a along the cross-section orientation incline. Angles of those inclination from a front surface of the first passivation film 3 and a front surface of the second passivation film 4 to a surface of the electrode pad metal 2, which surface adheres to the metal film 11, are differed, whereby a contiguous shape is formed.

In other words, the side surface of the second electrode-pad opening section 4a, on which the metal film 11 is formed, inclines outwardly from a rear surface of the second passivation film 4 to a front surface of the second passivation film 4. The side surface of the second passivation film 4 forms a curved surface contiguous to the front surface.

Further, the side surface of the second passivation film 4 forms a curved surface contiguous also to a surface of the first passivation film 3, which surface adheres to the metal film.

Figure 8:
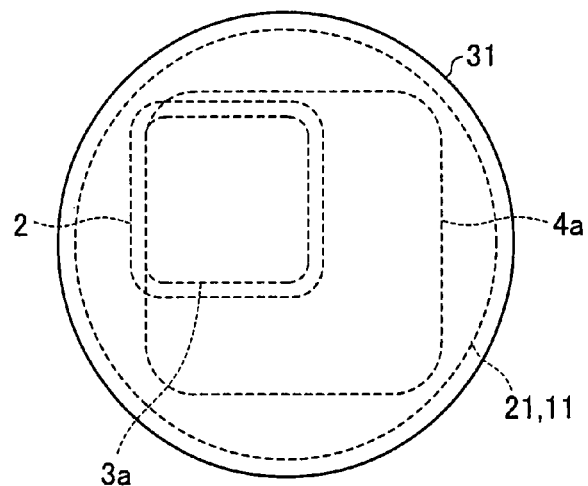
FIG. 8 is a plan view showing another structure of the external connection terminal section of the semiconductor device.

It is preferable that a cross section of the first electrode-pad opening section 3a and a cross section of the second electrode-pad opening section 4a along the surface orientation (surface orientation horizontal to a wafer surface) be formed in quadrilateral (polygon) shape having each corner section being rounded. Specifically, the first electrode-pad opening section 3a in FIG. 4 has corner section. It is, however, preferable that each corner section of the first electrode-pad opening section 3a is rounded, as shown in FIG. 8. Those round shapes in the cross-section orientation and in the planar orientation are necessary to maintain adhesion between the metal films 21 and 11, both of which constitute the external connection terminal.

If side walls of the first and second electrode-pad opening sections 3a and 4a, on which the metal films 21 and 11 are to be formed, are vertically formed along a planar orientation, the metal films 21 and 11 are less likely to be covered properly. This is likely to cause peeling-off. Moreover, if the first passivation film 3 and the second passivation film 4 are made of different materials, because the materials differ in the coefficient of linear expansion, stress is applied, in the cross-section orientation and in the horizontal orientation, on the interfaces due to change in operating temperature.

With the structure of the present embodiment, the side surfaces of the first electrode-pad opening section 3a and the second electrode-pad opening section 4a are inclined, and the angles of those inclination are differed, whereby a contiguous curved surface is formed from the front surface of the first passivation film 3 and the front surface of the second passivation film 4 to a section of the rear surface of the first passivation film 3, which section adheres to a base metal film. Thus, there is no spot of concentration of stress, which causes cracking, so that stress is dispersed. Further, the angles of inclination are differed from the front surface of the first passivation film 3 and the front surface of the second passivation film 4 to the section adhering to the base, whereby the contiguous shape is formed. Thus, the metal film improves in covering, and adheres more assuredly. Further, there is no singularity, so that the stress is dispersed more effectively.

With this structure, concentration of stress is avoided. Thus, the metal film 11 is less likely to peel off or crack. Therefore, moisture is prevented from entering the device via the electrode pad metal 2.

The following describes the shapes of the first and second electrode-pad opening sections 3a and 4a along the horizontal orientation (planar orientation).

A main material of the semiconductor chip 1, a material of the first passivation film 3, and a material of the second passivation film 4 are different, and therefore differ in coefficient of linear expansion. Thus, stress is applied to the interfaces due to change in operating temperature. If the corner sections have corners, stress is concentrated at a top of the corner. This causes peeling-off or cracking in this section. If moisture enters through this crack, the interface further peels off.

For this reason, it is preferable that a cross section of the first electrode-pad opening section 3a and a cross section of the second electrode-pad opening section 4a along a surface orientation (surface orientation horizontal to the wafer surface) be one of ellipse-shaped, round-shaped, and polygon-shaped having each corner being rounded.

Figure 10:
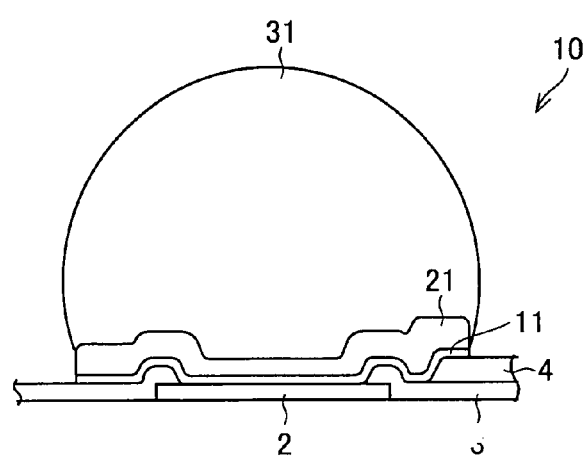
FIG. 10 is a sectional view showing another structure of the external connection terminal section of the semiconductor device.
Figure 11:
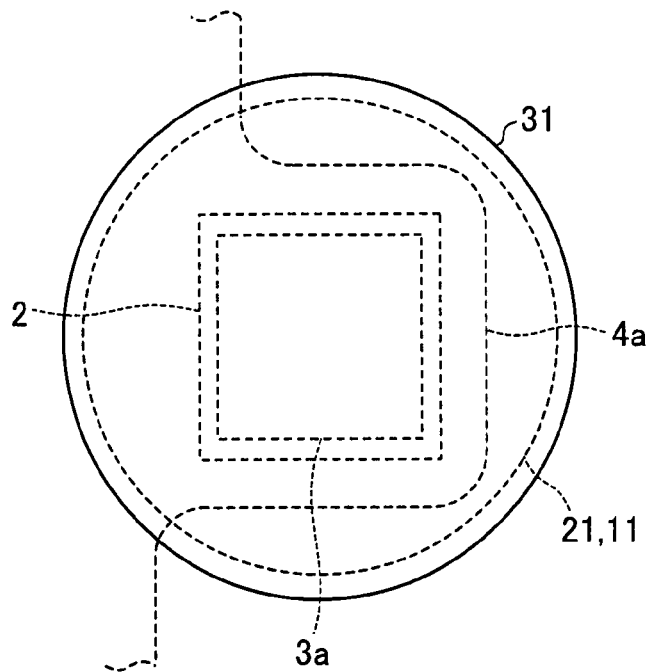
FIG. 11 is a plan view showing another structure of the external connection terminal section of the semiconductor device.

With regard to sections around the semiconductor chip 10, in which sections no device is formed, possibility of physical damage is low. Therefore, the second passivation film 4 does not necessarily have to be provided. Thus, for example as shown in FIGS. 10 and 11, the second passivation film 4 may be formed so as to cover partially instead of covering the periphery of the electrode pad metal 2 entirely.

Further, it is preferable to form no film, such as inorganic passivation films and organic passivation films, in the scribe area 6, which is a cutting margin for dicing the wafer. Especially the organic materials that are soft and highly elastic need to have an opening section.

To dice the wafer, a dicing blade is utilized. If the main material of the wafer is Si, the dicing blade is utilized with the diameters of diamond particles, types of binder materials to harden the Si, and a proportion of composition being optimized in a manner suitable for material properties of Si. The inorganic passivation films such as oxide films and nitride films have relatively similar properties, such as elasticity and hardness, to Si. Thus, dicing together with the Si is possible if dicing conditions are optimized (this dicing is more difficult than dicing Si solely, and is likely to cause chipping in the fragile inorganic passivation films).

However, when diced with the blade for Si, the organic passivation films such as polyimide, polybenzoxazole (PBO), and epoxy are likely to cause the blade to clog, which causes the Si or the inorganic passivation films to chip. Further, the organic materials are likely to cause threads. This causes troubles during conveyance in following steps or during mounting. Further, in a case in which laser is utilized, the organic passivation films may be altered by heat and thus deteriorated in reliability such as elasticity (shock-resistance) and chemical resistance.

Thus, in the present embodiment, a first scribing line opening section is formed over the scribe area 6 of the first passivation film 3, and a second scribing line opening section is formed over the scribe area 6 of the second passivation film 4. The second scribing line opening section is greater in width than the first scribing line opening section of the first passivation film 3. The foregoing is to ensure that the second passivation film 4 is separated from the cutting margin for dicing, taking positional accuracy into consideration.

The following describes the external connection terminal.

Generally, a seated height of a semiconductor device is limited in many cases in relation to the dimensions of the device. In this case, the metal film may be utilized as the external connection terminal. In the present embodiment, the metal films 21 and 11 are utilized as the external connection terminal.

Specifically, several tens μm to one hundred and several tens μm of solder paste is provided to the terminals (land) on the substrate. Then, the metal films 21 and 11, which constitute the external connection terminal of the semiconductor chip 1, are provided so as to be aligned with the position of the land, and thermally treated with a reflow oven or the like, whereby the metal films 21 and 11 are mounted.

Further, a resin film (anisotropic conductive film: ACF) containing conductive particles or liquid resin (anisotropic conductive paste: ACP) containing conductive particles may be adhered or applied to the surface of the semiconductor device, on which surface the device is formed, or to the substrate, and thermally pressed so as to be bonded. In this case, it is preferable that a surface of the land of the substrate be on a same level as or a higher level than a surface of an insulating film. It is necessary that the total of the height of the metal film and the difference in level between the surface of the land and the insulating film be at least greater than the diameters of the conductive particles.

ACF or ACP provides electrical connection along the thickness orientation in such a manner that conductive particles contained in ACF or ACP come into contact with (or the conductive particles are dug into) the metal film 21 and the terminal (land) of the substrate. Therefore, for example if the surface of the land of the substrate and the surface of the insulating film are on the same level, and if the diameter of the conductive particles is 10 μm, the metal films 21 and 11 need to be formed with the thickness greater than 10 μm, in order to have the connection at a desired position of the external connection terminal.

If there is some margin in seated height of the semiconductor device, the bump can be formed on the metal film. It is difficult to obtain a perfect state of mounting by applying solder to the substrate. Further, stress concentrated on the bump due to the difference in coefficient of linear expansion of the semiconductor substrate resulting from change in operating environment temperature is dispersed all over the height of the bump. In comparison of a high bump with a low bump, the high bump receives stress in a larger section, so that the stress applied is more dispersed.

Further, in the present embodiment, a cross section (surface vertical to the wafer surface) of the metal film 21 along the laminate orientation is formed in such a manner that each corner section is rounded, as shown in FIG. 3.

With this structure, a cross section of the interface with bonding materials, such as solder, used in mounting does not form a straight line along the laminate orientation. Thus, peeling-off and cracking at the surface of the metal film are less likely to be caused. Even if peeling-off or cracking occurs, further peeling-off or cracking is prevented. Further, if the electrical connection is to be established by bringing metal particles such as ACF into contact, electrical shorting between adjacent terminals is prevented when the ACF (ACP) is bonded with a fine pitch.

Further, in the case in which solder paste is provided to the semiconductor substrate to connect the external connection terminal via solder, or in the case in which the bump is formed on the metal film with the use of a metal having a low melting point such as Sn-group solder and especially lead-free solder, stress is concentrated on the external connection terminal section resulting from change in operating environmental temperature of the semiconductor device, due to the difference in coefficient of linear expansion from the semiconductor substrate.

On the other hand, with the structure of the present embodiment, each corner section of the cross section is formed in round shape so that cracking along the interface between the solder and the metal film is prevented. Even if cracking occurs, this crack is prevented from spreading.

Specifically, fillet of bonding materials such as bump materials is formed around the metal film. Thus, cracking is prevented. Even if tiny cracking occurs, this crack is prevented from spreading, as the cross section of the interface between the solder and the metal film does not form a straight line along the laminate orientation.

Further, except for the rounded sections of the periphery sections of the metal film, the rounded sections of the corner sections of the metal film along the cross-section orientation have no corner that may become singularity. Thus, stress due to the difference from the substrate is dispersed. Further, there is no corner where entangling voids in bonding materials or voids caused by flux components, utilized in solder bonding, during reduction reaction of the metal film are likely to stick. In other words, the interface through which cracking is easily spread has no void, which is likely to cause cracks to spread. Thus, cracks are prevented from spreading.

The metal film 21 can be rounded by dry etching or wet etching. If over-etched, the metal film 21 can be rounded further. This is therefore more effective.

In a case of plating, the same shape is obtained by growing the plating so as to be higher than the resist to become mushroom-shaped. If the metal film 21 is coarser in structure, the metal film 21 is easily etched. Thus, the round shape is easily formed by etching. This is therefore more effective.

Further, in a case of forming in liquid phase or vapor phase, the metal film 21 grows to have a coarse structure if the growth speed is increased. Therefore, it is preferable to adjust the uppermost layer of the metal film so as to be coarse in a manner that depends on the density of the structure of the base, whereby a larger round shape is formed while the base layer is eliminated.

If wet etching is carried out in a case in which the uppermost layer is denser in structure, a side surface of a base layer is greatly etched. Etching solution tends to remain in this section and is likely to cause corrosion thereafter. Even if the base layer and the uppermost layer are equal, the width of the metal film is narrowed with wet etching. Therefore, the area connected an external equipment becomes smaller. On the other hand, with dry etching (physical etching), the surface of the semiconductor chip 10 is processed with excessive energy to round the uppermost layer. This raises concerns about damage on the device.

Taking the foregoing into consideration, the metal films 11 and 21 of the present embodiment are arranged as follows.

It is preferable that the metal films 11 and 21 be formed as follows. The metal films 11 and 21 are constituted of a laminate including the following three layers: a first layer, which is an uppermost layer; a second layer provided directly below the uppermost layer; and a third layer, which is a lowermost layer and serves as a barrier layer. The first layer and the second layer are made of a same metal or a material containing, as a main component, a same metal. The metal of the first layer is coarser in structure than that of the second layer.

The foregoing makes it possible to easily form the metal films 11 and 21 in such a manner that each corner section of the cross section (surface vertical to the wafer surface) in the laminate orientation is rounded. Further, the first layer, which is the uppermost layer, and the second layer, which is the base layer, have a same metal as a main component. Thus, it is possible to concurrently carry out eliminating the metal of the second layer and rounding the cross section of the metal of the first layer, which is the uppermost layer. This is described in detail below, in the description of the step of forming the metal films 11 and 21 with the above structure by electric plating.

First, the third layer and the second layer are formed all over the wafer sequentially. Then, photoresist is applied onto the wafer by spin coating and then dried. Thereafter, a photoresist opening section, in which the metal films 11 and 21 are to be formed, is formed by exposure and development. This is followed by forming the first layer (e.g. Cu) of the metal film 21 in the photoresist opening section by electric plating. Then, the photoresist is eliminated.

Then, the second layer formed all over the wafer is eliminated, with the use of the first layer of the metal film 21 as a mask, by chemical etching (dry etching) using chemical solution (wet etching), or physical etching (dry etching) using reactive gas and sputtered atoms (molecules) or the like.

In the step of eliminating the metal of the second layer, the metal of the second layer is eliminated with the use of a substance that reacts with the second layer to etch, especially when chemical etching is conducted. If the first layer is made of the same metal as the second layer, or if the first layer is made of the material whose main component is the same metal as the second layer, the first layer is also etched.

Further, generally, an edge section is etched in a more concentrated manner than a flat section. Thus, the edge section is rounded. Furthermore, the coarser the structure of the first layer is, the more the first layer is etched. Thus, the first layer is easily rounded in the process of removing the second layer by etching. Therefore, the first layer is easily rounded during the step of eliminating the metal of the second layer by etching. Thus, it is possible to concurrently carry out eliminating the metal of the second layer and rounding the cross section of the metal of the first layer, which is the uppermost layer.

In physical etching, the etching rate also differs in a manner that depends on the type of the metal. If structures of metals, alloys, or compounds of same type are different in density, coarsest parts are etched more easily than a dense part. However, physical etching is likely to cause damage on the semiconductor chip. Therefore, chemical etching is preferable.

Then, the third layer is eliminated by chemical etching with the use of chemical solution or reactive gas, or physical etching with the use of sputtered atoms/molecules or the like.

In the present embodiment, the third layer, which is the lowermost layer, is formed so as to have the thickness of 0.03 μm, by which thickness barrier effects are produced, with the use of Ti among Ti, Ti—W, and Cr, all of which are excellent in producing barrier effects. The second layer, which is the base metal layer of the uppermost layer, is formed so as to have the thickness of 0.1 μm with the use of Cu. Cu is also utilized to form the uppermost layer (first layer) in the same manner as the second layer, but Cu of the uppermost layer is coarser in structure than that of the second layer. Further, the metal film 21 and the metal film 11 are formed in such a manner that the total thickness of the metal films 21 and 11 becomes 5 μm.

The total thickness of the first layer and the second layer, both of which are made of Cu, is important in connecting to Sn-group solder material. With the foregoing structure, the diffusion layer of Cu and Sn does not reach the third layer, which is the barrier layer, during thermal treatment for mounting on the substrate and mounting other components. Thus, the problems of peeling-off or cracking the metal film are less likely to occur.

The following describes growth of an alloy layer, with reference to experimental data.

Sn-group solder undergoes a total of three thermal treatments: a thermal treatment for bonding the Sn-group solder to the metal film; a thermal treatment for mounting the semiconductor device on the substrate; and a thermal treatment for mounting other components. The thickness of the alloy layer grown on a side close to the metal film 21 and the metal film 11 is confirmed to be approximately 1.8 μm. Accordingly, at least the metal film of 1.8 μm (the total thickness of the uppermost layer (first layer) and the base metal layer (second layer) formed directly below the uppermost layer) is necessary (if the operating environment is at a room temperature, and if the temperature of the semiconductor device hardly increases during the use).

As a result of a high-temperature storage test conducted at 150° C., it is confirmed that the alloy layer after 1000 hours is 4.5 µm. Thus, in consideration of increase in temperature of the device during the use, the first layer and the second layer are formed so as to have the total thickness of 4.5 µm or above in the present embodiment.

In the present embodiment, Cu is utilized in the uppermost layer of the metal film, as described above. The present technology, however, is not limited to Cu, and for example Au, which produces anti-oxidization effect, may be employed. If Sn and Au are overgrown, a brittle alloy layer is formed. Therefore, Au needs to be 1 µm or below.

Further, if Cu is formed on the base metal layer (second layer) of the metal film 21, it is not possible to round the metal film, which will be described later, concurrently with the step of eliminating the base layer of the metal film. On the other hand, if the base layer is made of Au, it is preferable to form the uppermost layer of the metal film with Au. In this case, however, the total thickness of the uppermost layer and the base layer of the metal film needs to be 1 µm or below due to overgrowth of the alloy layer. This raises concerns about diffusion of Sn to the barrier layer (third layer).

If the metal film is to be rounded to a radius of approximately 0.2 µm, the thickness of the metal film decreases by 0.2 µm. Therefore, the base layer and the uppermost layer before the process of rounding need to be formed so as to have the total thickness of 4.7 µm or greater (if the operating environment is at a room temperature, and if the temperature of the semiconductor device hardly increase, the total thickness needs to be 2 µm). The sections of the metal films 21 and 11 other than the peripheral sections, for example the sections of different levels in the vicinity of the side walls of the first electrode-pad opening section 3a and second electrode-pad opening section 4a, are formed at changed inclination angles. Thus, the metal film 21 and the metal film 11 are covered well.

Further, the sections of different levels in the central section of the metal films 21 and 11 are rounded by etching so that, in bonding the solder, the solder is assuredly bonded to the semiconductor substrate. For example if the sections of different levels have a corner, the air may be caught, or a void, which is caused by flux used in solder bonding, does not escape to the outside and stays at this corner section during the solder bonding. This may trigger cracking or peeling-off of the solder connecting section, or may worsen cracking or peeling-off. Further, there is no singularity, so that stress is dispersed. Thus, peeling-off and cracking are prevented.

In the present embodiment, the sections of different levels, formed with the first electrode-pad opening section 3a and the second electrode-pad opening section 4a, are rounded, and the bump is formed with the use of Sn—Ag group alloy, which is lead-free solder. The higher the bump on the metal films 21 and 11 is, the more the thermal stress is dispersed. It is confirmed in a temperature cycling test (125° C./−40° C.) that the bump having the height of 100 µm or higher and mounted on the substrate does not break even after undergoing 500 cycles.

Figure 2:
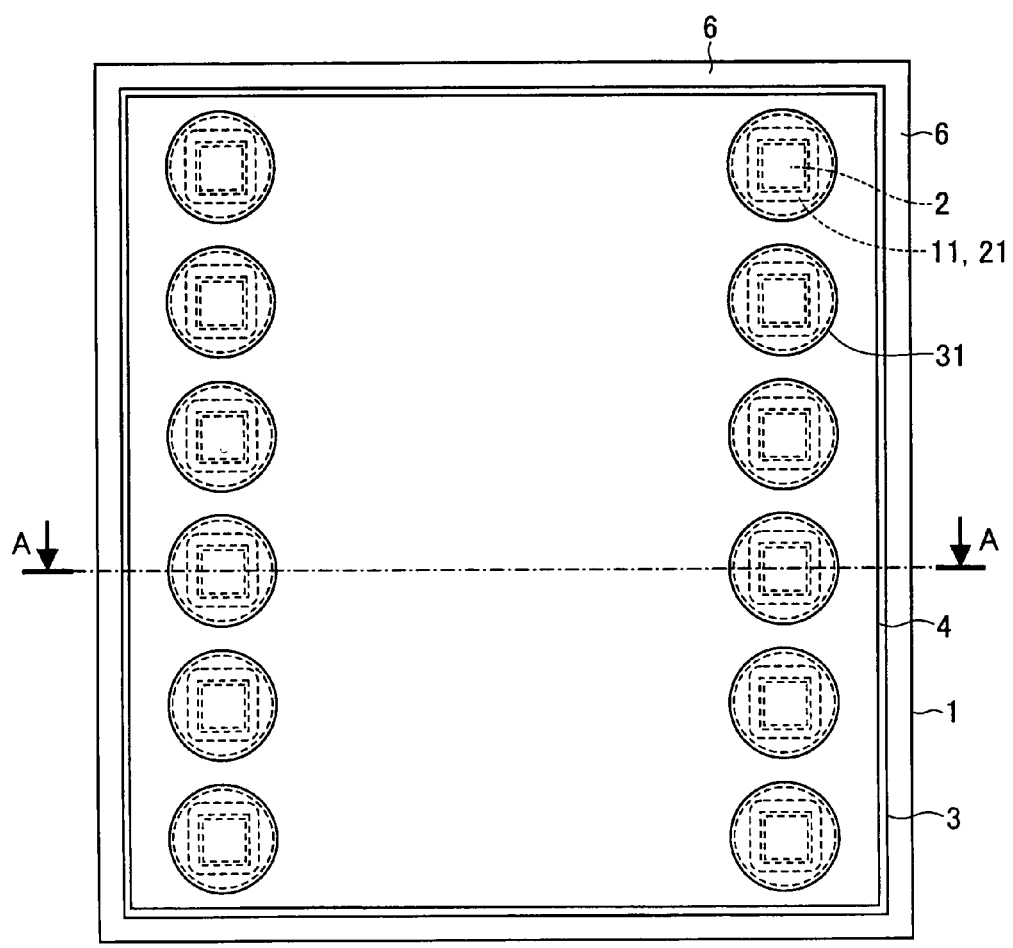
FIG. 2 is a plan view showing a structure of the semiconductor device.
Figure 6:
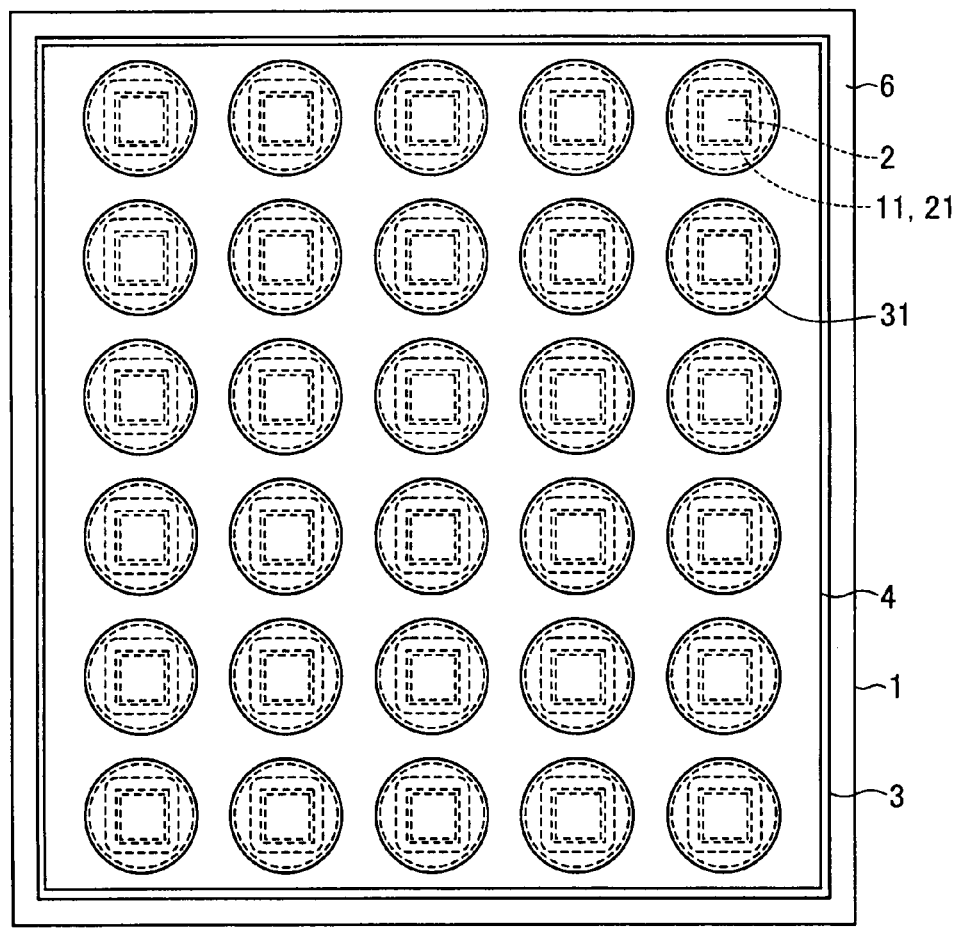
FIG. 6 is a plan view showing a structure of a semiconductor device.

In the semiconductor device shown in FIG. 2, the electrode pad metal 2 is formed in the peripheral section of the semiconductor chip 1. It is also possible to provide the electrode pad metal 2 at a central section of the semiconductor chip 1, as shown in FIG. 6. Forming the electrode pad metal 2 in this two-dimensional manner allows more pieces of external connection terminals to be provided within a limited space on the semiconductor chip.

Figure 5:
FIGS. 5(a) to 5(e) are schematic diagrams showing the steps in manufacturing the semiconductor device shown in FIG. 1.
Figure 5:
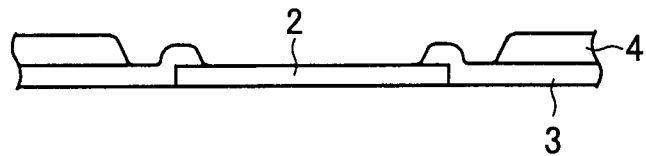
Figure 5:
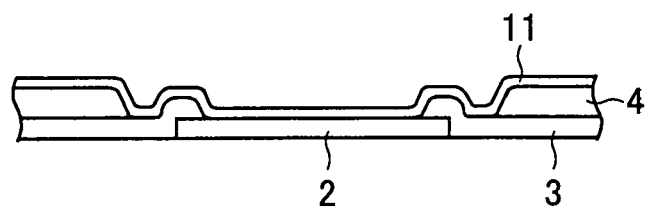
Figure 5:
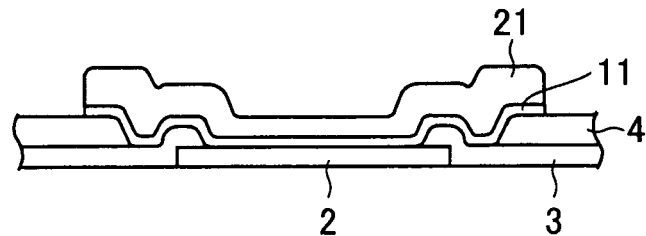
Figure 5:
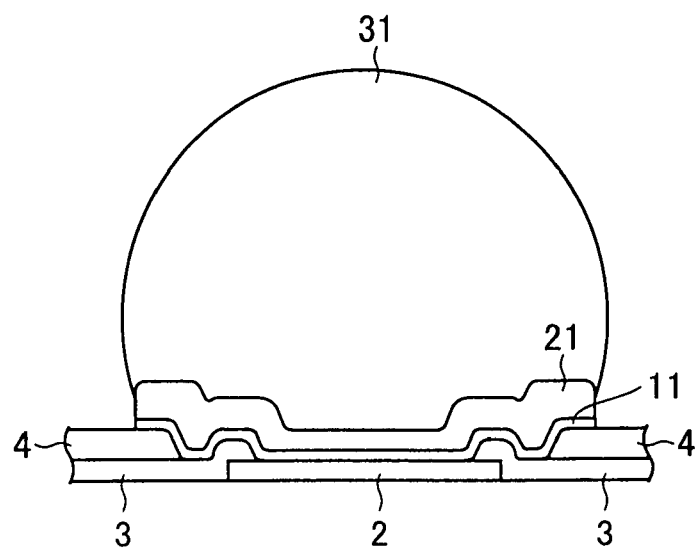

FIGS. 5(*a*) to 5(*e*) show the steps in the method of manufacturing the semiconductor device in accordance with the present embodiment. In view of convenience of description, the vicinity of the electrode pad is enlarged in the figures. In actual production process, the semiconductor device is manufactured wafer-by-wafer. First, many electrode pad metals 2 are formed by the device unit on the semiconductor wafer having many devices formed on a flat surface of the semiconductor wafer. A nitride film that is the first passivation film 3 is formed and grown in vapor phase so as to be formed all over the semiconductor wafer. Then, opening sections (first electrode-pad opening section, first scribing line opening section) are formed inside of the electrode pad metal 2 and in the scribe area 6. The opening sections may be formed, by adjusting the conditions of dry etching, in such a manner that the surface of the first passivation film 3, which surface adheres to the base, is inclined to form a contiguous slope.

Thereafter, corners of the front surface of the first passivation film are rounded off by argon or fluorine plasma or the like, whereby the first passivation film 3 is inclined from the front surface to the surface adhering to the base. It is also possible to employ a combination of dry etching and wet etching.

If the passivation film contains phosphorus, the passivation film changes in shape at a relatively low temperature. Thus, it is possible by carrying out a thermal treatment to form a contiguous inclined surface from the front surface of the passivation film to the surface adhering to the base. If Al is utilized in the electrode pad metal 2 or the like, the thermal treatment needs to be carried out at a temperature lower than the melting point, which is 660° C.

Then, polyimide, which is the second passivation film 4, is applied on the first passivation film 3 already formed on the semiconductor substrate 1. The second electrode-pad opening section 4a and the second scribing line opening section are formed in such a manner that the side walls of the second passivation film 4 come outside of the periphery of the electrode pad metal 2 and also outside of the first scribing line opening section.

To incline the side wall of the second electrode-pad opening section 4a, it is easier with wet etching than with dry etching. Therefore, wet etching is employed to incline the side wall in the present embodiment.

Polyimide in varnish form is applied onto the semiconductor wafer by spin coating and then dried. Thereafter, positive type photoresist is applied by spin coating and then dried. Then, exposure is carried out on the second electrode-pad opening section 4a and the second scribing line opening section by use of a glass mask and form an opening section in the photoresist with the use of development solution of alkali group or the like, whereby the opening section is formed outside of the first electrode-pad opening section 3a, which is within the section of the electrode pad metal 2, and the first scribing line opening section. Then, the polyimide is etched with the development solution for photoresist by use of the photoresist as a mask. It is suitable to make the side walls of the opening sections incline to form a contiguous slope by setting a drying temperature for the polyimide low and setting an alkali concentration of the etching solution high to generate drips along the opening sections after the etching.

The polyimide is hardened by thermal treatment. In this step of hardening, it is suitable to carry out, prior to main hardening, preheating at a low temperature by which hardening is less likely to occur, and then carry out the main hardening at a hardening temperature. There is also a method in which processing is carried out including the course of rises in temperature from the preheating temperature to the main hardening temperature. Suitably combining the processes produces more effects. As a result, an inclined surface contiguous from the front surface to the rear surface of the second passivation film 4 is produced.

Further, if the corner sections of the front surface of the second passivation film 4 are eliminated by oxygen, argon, or fluorine plasma processing, the contiguous inclined surface is easily formed. This plasma processing may be combined with the plasma processing for rounding the first electrode-pad opening section 3 if the first electrode-pad opening section 3a is completely exposed from the second electrode-pad opening section 4a in the same manner as in the present embodiment.

In the present embodiment, non-photosensitive type, which is relatively easier to form inclination, is employed. If a photosensitive-type is employed, a positive type is preferable because it is easily opened wider on the front surface side than on the bottom surface side of the film. In a case of a stepper for exposure, it is suitable to set a focus away toward the front surface of the semiconductor wafer at the time of exposure. In a case of a one-shot exposure equipment, it is suitable to set the mask away from the semiconductor wafer. Further, it is preferable that the doses of exposure be slightly excessive. The rest of the steps are the same as those discussed above to form the contiguous inclined surface, in both cases of non-photosensitive and photosensitive.

Further, it is possible to round the flat surfaces of the first electrode-pad opening section 3a and the second electrode-pad opening section 4a by use of the drips discussed above. Further, if the pattern of the glass mask is rounded in the steps of forming the first electrode-pad opening section 3a and the second electrode-pad opening section 4a, it becomes even easier to form the rounded shapes.

The following describes how the metal films 21 and 11 are formed.

First, Ti is formed all over the semiconductor wafer by sputtering, until the thickness of Ti becomes 0.03 µm. The Ti is a barrier layer 11, and at the same, a layer to adhere to a base that is a lowermost layer. Then, Cu is formed, by sputtering, all over the Ti thus formed, until the thickness of Cu becomes 0.1 µm.

Then, photoresist is applied to this Cu sputtered film by spin coating, and then dried. Thereafter, an opening section is formed by photolithography in such a manner that the opening section comes outside of the peripheral section of the second electrode-pad opening section 4a, and the second electrode-pad opening section 4a comes approximately at the center of the opening section.

Then, a Cu film is formed on this photoresist opening section by electric plating. In the present embodiment, photoresist is formed to the thickness of 6 µm so that the total thickness of the metal film becomes 5 µm.

Thereafter, the photoresist is eliminated with the use of peeling-off solution. The Cu sputtered film is eliminated with etching solution by use of the metal film of 5 µm as a mask. At this time, over etching is carried out for a time period that is 1.5 to 5 times longer than the period for eliminating the Cu sputtered film, whereby the peripheral section of the uppermost layer of the metal film is rounded.

In the present embodiment, the peripheral section is rounded for a time period that is 1.5 times longer than the period of eliminating the Cu sputtered film so as to have the radius of approximately 0.2 µm. This is because the uppermost layer of the metal film is relatively coarse in structure, and 1.5-fold over etching is carried out. If the Cu sputtered film is to be eliminated by 0.1 µm, the uppermost layer of the metal film is etched by approximately 0.1 µm, and the peripheral section of the uppermost layer of the metal film is rounded so as to have the radius of 0.1 µm. To further round the rounded sections, over etching is further carried out, or a plasma treatment with Ar or the like is carried out.

Then, the Ti sputtered film is eliminated with etching solution, and the metal film 21 and the metal film 11 are formed.

Thereafter, flux is applied onto the metal films 21 and 11, rounded sections around the metal films 21 and 11, and side surfaces, and a lead-free solder ball is mounted. At this time, the center of the second electrode-pad opening section 4a is approximately at the center of the metal films 21 and 11. Therefore, the bump 31 (solder ball (metal ball)) does not move to an end of the metal films 21 and 11, and therefore is assuredly bonded (after the subsequent thermal treatment) to the interface between the metal film 21 and the metal film 11 (there is no section that is not bonded).

Then, thermal treatment is carried out in a reflow oven under N2 atmosphere to form, on the metal films 11 and 21, the bump 31 having the height of 200 µm.

The peripheral sections of the metal films 21 and 11 are rounded so that the interface with the solder bump 31 is formed along the rounded sections. The flux is applied to the rounded sections so that reactivity of the rounded sections improves. Thus, fillet is easily formed. Further, the larger the rounded sections are, the larger the fillet is formed. Thus, the area of bonding increases.

Further, the interface, which tends to cause a rupture, is formed with a greater curvature radius. Thus, stress concentrated on the peripheral sections of the metal films 21 and 11 are dispersed, and rupture at the interface between the solder and the metal film can be suppressed.

Further, if the peripheries of the metal films 21 and 11 are not rounded, it is not possible to cover the side surface with the bump material due to surface tension of the bump material heated to or above the melting temperature. For this reason, in the present embodiment, the rounded shapes are further rounded so that the side surface of the metal film is covered by the bump material. Thus, physical connection between the bump material and the metal film becomes more stable, which in turn suppresses the problems of cracking the metal films 11 and 21.

Further, even if the metal film 21 is made of a material that is easily oxidized, e.g. Cu as in the present embodiment, the metal film 21 is prevented from being oxidized at the side surface. Thus, the metal film that becomes brittle is prevented from peeling off without deteriorating electric conductivity. The flux is applied also to the side surfaces of the metal films 21 and 11 so that reactivity of the side surfaces of the metal films 21 and 11 improves. Thus, the bump material is more likely to cover the side surface.

Other method of forming the bump on the metal films 11 and 21 is to print bump material such as solder paste. Specifically, the opening sections of the mask for printing are aligned with the metal films 21 and 11. Thereafter, solder paste is provided in the opening sections of the mask by use of a squeegee, and then heated in an N2 reflow oven or the like after the mask is eliminated, whereby the bump is formed. In this case, the opening sections of the mask are formed larger than the metal films 21 and 11, and the solder is applied so as to cover the side surfaces of the metal films 21 and 11. Thus, it becomes easy to cover the side surface of the solder bump after the thermal treatment.

In this case, however, surface tension works. Therefore, it is preferable to round the peripheral sections of the metal films 21 and 11.

The semiconductor device manufactured by the foregoing steps and mounted on the substrate underwent at least 1000 cycles in a temperature cycling test (125° C./−40° C.).

Embodiment 2

Figure 7:
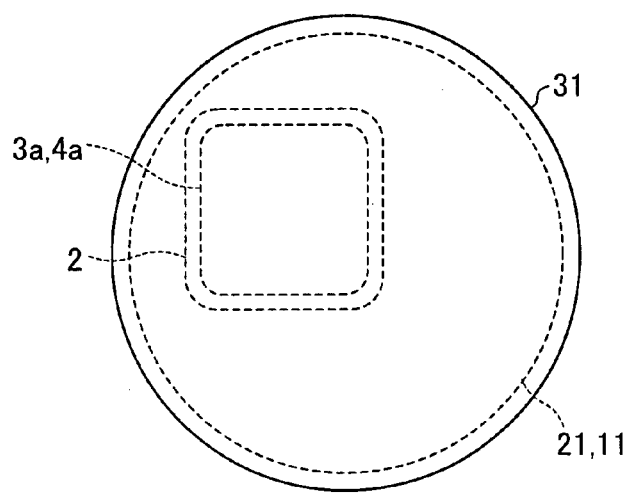
FIG. 7 is a plan view showing another structure of the external connection terminal section of the semiconductor device.

The following describes another embodiment with reference to FIGS. 7 and 8.

In the structure of Embodiment 1 shown in FIG. 4, the center of an opening section 3a of a first electrode pad is positioned almost at the center of an opening section 4a of a second electrode pad and metal films 11 and 12. In the present embodiment, the opening section 3a and the opening section 4a are formed in such a manner that a periphery of the opening section 4a substantially accords with a periphery of the opening section 3a in the direction in which the circuit is formed, as illustrated in FIG. 7. Another difference from the structure of Embodiment 1 is that the opening section 3a and the opening section 4a are not positioned at the center of the metal films 11 and 21.

Further, as shown in FIG. 8, the opening section 4a may be positioned in the center of the metal films 11 and 21, while the opening section 3a is positioned so as to deviate from the center of the metal films 11 and 21, whereby the opening section 3a partially coincides with the opening section 4a.

With the structure of the present embodiment, at least a part of the metal films 11 and 21 is not in intimate contact with the first passivation film 3. Therefore, the effect of preventing moisture from entering is not obtainable, compared with the structure of Embodiment 1. However, with the structure of the present embodiment, the second passivation film 4 low in adhesion is formed so as not to be in direct contact with the electrode pad metal 2 Therefore, the effect of preventing the metal films 21 and 11 from peeling off is enhanced, compared with, for example, the conventional technique of Patent Document 1.

Further, with the structure of the present embodiment, the degree of freedom increases in the position of the electrode pad metal (electrode pad) 2 to be formed. The structure of the present embodiment is therefore suitable in a case in which there is a limitation in layout of the electrode pad metal 2 and the external connection terminal, for example.

Further, in the present embodiment, not only each corner section of the opening section 3a but also each corner section of the electrode pad metal 2 are formed in round shape. Forming each corner section of the electrode pad metal 2 in round shape makes it possible to avoid concentration of stress on the interface with the first passivation film 3. Thus, the metal film is prevented from peeling off and cracking more effectively.

The following describes a manufacturing method of a semiconductor device in accordance with the present embodiment, with reference to FIG. 7.

In the method of manufacturing the semiconductor device as shown in FIG. 7, the opening section 4a may be formed after the opening section 3a is formed, in such a manner that the opening section 4a coincides with the opening section 3a, in the same manner as in Embodiment 1.

In the present embodiment, photosensitive resin such as photosensitive polyimide and photosensitive polybenzoxazole (PBO) is employed, in place of photoresist, as a material to be utilized to form the opening section 3a of the first passivation film 3.

The photoresist is eliminated after the first passivation film 3 is formed. If, however, the photoresist is photosensitive resin material for protecting films such as photosensitive polyimide and photosensitive PBO, the photoresist can be utilized as the second passivation film 4.

For this reason, it is preferable that the inner surface of the opening section 4a inclines so as to have a larger inner circumference on the upper surface side of the second passivation film 4. Therefore, positive type materials are preferable.

The semiconductor device shown in FIG. 8 is produced by the same method and steps as those in Embodiment 1.

Embodiment 3

Figure 9:
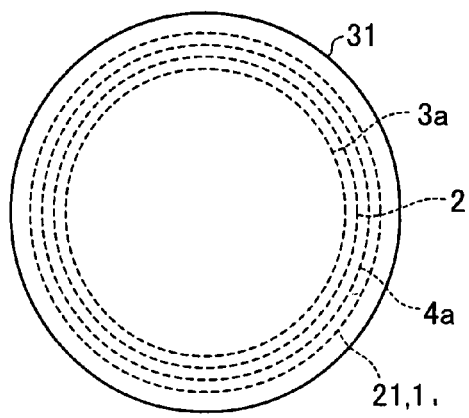
FIG. 9 is a plan view showing another structure of the external connection terminal section of the semiconductor device.

The following describes another embodiment with reference to FIG. 9.

As shown in FIG. 9, the present embodiment is different from Embodiments 1 and 2 in that all of an electrode pad metal 2, an opening section 3a of a first electrode pad, an opening section 4a of a second electrode pad, and metal films 21 and 11 are formed in round shape.

In other words, the opening section 3a and the opening section 4a in the present embodiment are in round shape, whereas those in either of Embodiments 1 and 2 are formed in the shape of a quadrilateral (polygon) in which every corner section is rounded.

Those rounded parts of the corner section of the opening section 3a and the opening section 4a do provide stress dispersion effect. Forming either of, or both of, the openings 3a and 4a in round shape allows further increase in the stress dispersion effect. Further, the electrode pad metal 2 is formed in round shape so that the stress dispersion effect is increased even further.

With the structure of the present embodiment, even if the opening section 4a is reduced to approximately the size of the electrode pad 2, the metal film 21 and the metal film 11 come into intimate contact with the vicinity of the electrode pad, and also with all over a part of the first passivation film 3, which part is in the vicinity of the electrode pad metal 2.

The round shape is employed in the present embodiment, but the same advantages are produced with the shape of an ellipse.

A manufacturing method of a semiconductor device in accordance with the present embodiment is same as that of Embodiment 1, except that an electrode pad metal section of a glass mask for photolithography, the opening section of the first electrode pad, and the opening section of the second electrode pad are formed in round shape or in the shape of an ellipse.

Embodiment 4

Figure 12:
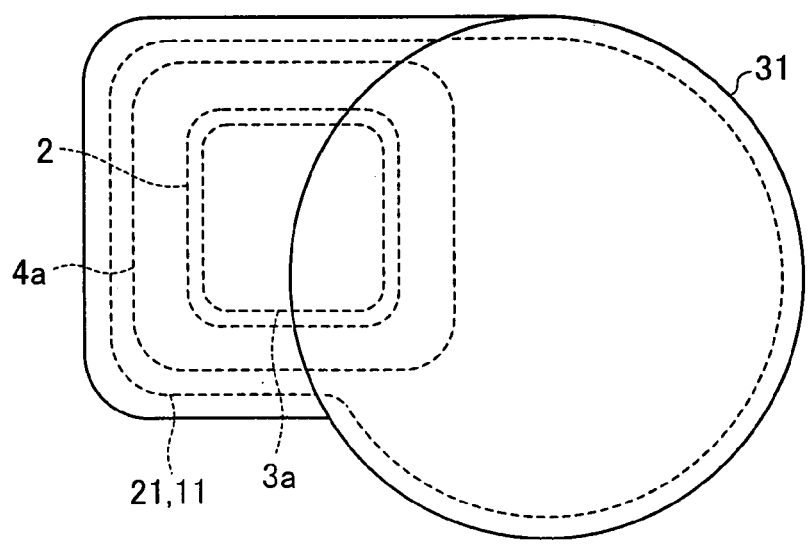
FIG. 12 is a plan view showing another structure of the external connection terminal section of the semiconductor device.
Figure 13:
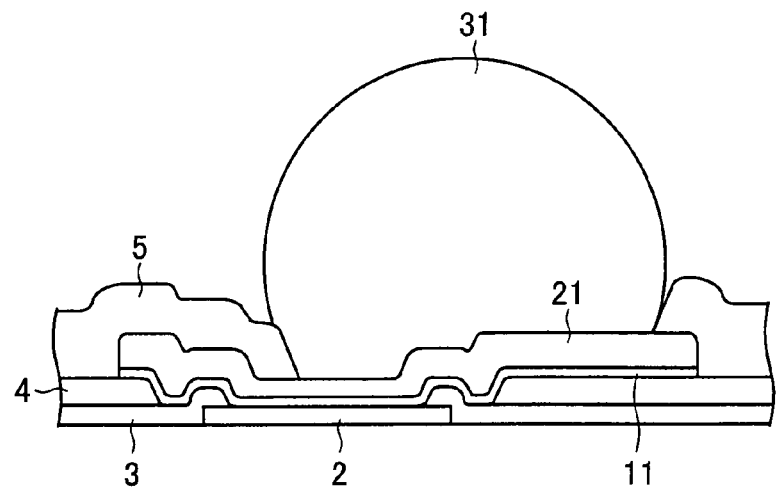
FIG. 13 is a sectional view showing another structure of the external connection terminal section of the semiconductor device.
Figure 14:
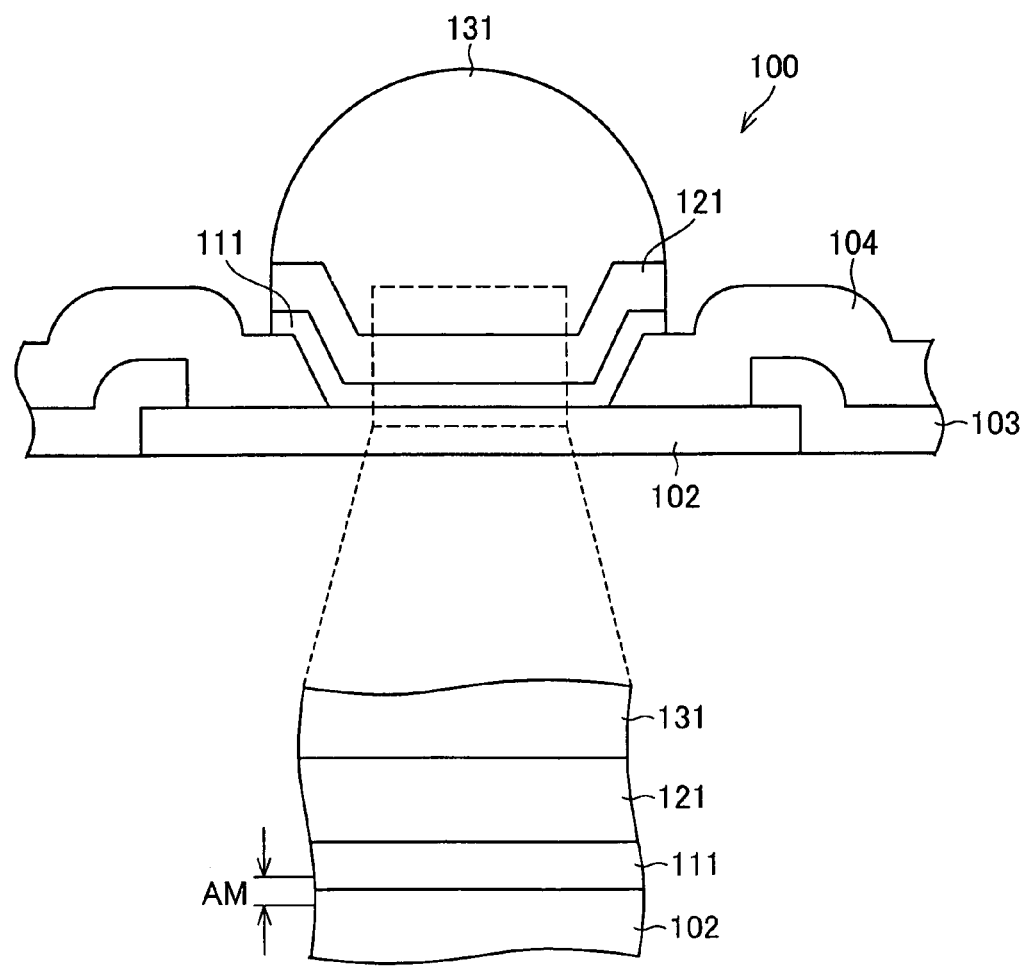
FIG. 14 is a sectional view showing a structure of an external connection terminal section of a conventional semiconductor device.

The following describes another embodiment with reference to FIGS. 12 and 13.

In Embodiments 1 to 3, a bump 31, which is an external connection section, overlaps the electrode pad metal 2 in a laminate orientation. In the present embodiment, the center of the bump 31 is above the second passivation film 4, as shown in FIG. 12.

Thus, in the present embodiment, the metal films 11 and 21 have a section bonded to the electrode pad metal 2 and a section bonded to the bump 31 formed on the second passivation film.

With this structure, the degree of freedom in an area where the bump (external connection terminal) is formed further improves, compared with Embodiment 2. The structure is therefore suitable in a case in which there is a limitation in layout of the electrode pad metal 2 and the external connection terminal, for example. Further, the metal films 11 and 21 can be increased in size. In this case, stress due to the difference in coefficient of linear expansion between the semiconductor chip 1 and the substrate is dispersed all over the metal films 11 and 21 having a large size. Therefore, the problems of peeling-off or cracking the metal film can be more effectively suppressed.

In a case in which the semiconductor chip 1 is bonded to a metal having a low melting point, such as solder, solder or the like may flow all over the metal films 21 and 11, so that a desired shape of connection is not obtained. Therefore, a solder precluding section needs to be provided.

The present embodiment differs in that, as shown in FIG. 13, a third passivation film 5 is further formed on the metal films 21 and 11. FIG. 13 shows a structure in which a section of the metal film 11, which section adheres to the electrode pad metal 2, partially overlaps a section of the metal film 11, which section adheres to the bump 31 formed above the second passivation film 4.

In the same manner as in the second passivation film 4, polyimide can be utilized as a material of the third passivation film 5. However, an ordinary polyimide film, in many cases, cannot deliver intrinsic performance because it becomes brittle when formed on Cu. For this reason, a solder precluding section made of polybenzoxazole (PBO) is employed in the present embodiment.

Further, a bump made of Sn—Ag group lead-free solder is formed at a solder connecting section.

A method for manufacturing a semiconductor device in accordance with the present embodiment differs from Embodiment 1 only in that the third passivation film 5 is formed before the bump is formed. The third passivation film 5, however, can be formed with, basically, the same method and the steps as those for forming the second passivation film 4.

In the present embodiment, the third passivation film 5 is formed by the method below with the use of positive type photosensitive PBO as a material of the third passivation film 5.

First, PBO in varnish form is applied to the second passivation film 4 and the metal film 21, and to the metal film 11 and the second scribing line opening section, and then dried. Thereafter, a dam is formed by photolithography to form a solder precluding section so that the solder is prevented from flowing along the metal films 21 and 11.

Since Cu, which is easily oxidized, is utilized as the metal film, it is preferable to cover the metal films 21 and 11, except for the part of the metal film 21 and the part of the metal film 11, on which parts the bump is to be formed.

Further, to prevent chipping resulting from dicing, it is preferable to form a third scribing line opening section, which is formed with the third passivation film, to expose a first scribing line opening section entirely. Further, it is preferable that the third scribing line opening section be formed wider in width than the first scribing line opening section (the opening section may be narrower than the second scribing line opening section).

Then, the third passivation film 5 is hardened by thermal treatment. Mounting is possible even in this state by applying solder to the substrate. In the present embodiment, however, flux is supplied to the solder precluding section, a metal ball made of lead-free solder is mounted, and thermal treatment is carried out with the use of an N2 reflow oven or the like, whereby the bump is formed.

As the foregoing describes, in the present embodiment, the third passivation film 5 covers sections of the metal film 21, which sections are other than the section where the bump 31, which is the externally connected section, is formed.

With this structure, the solder material of the bump 31 is prevented from flowing on the metal film 21, and a desired shape of connection is obtained. Further, the third passivation film 5 protects the sections of the metal film 21, which sections are other than the section where the bump 31, which is the externally connected section, is formed. Thus, corrosion such as oxidization of the metal films 21 and 11 is retarded, and peeling-off and cracking of the metal film can be suppressed more effectively.

As described above, a semiconductor device provided with a semiconductor chip wherein an electrode pad is formed on a circuit formation surface includes: a first passivation film, which serves as an adhesive layer, formed on the circuit formation surface, with a first electrode-pad opening section from which the electrode pad is to be exposed; a second passivation film, which protects the semiconductor chip from external physical damage, formed on the first passivation film with a second electrode-pad opening section from which the electrode pad is to be exposed; and an external connection terminal which connects the electrode pad to an external equipment, the external connection terminal including a metal film formed so as to cover at least the first electrode-pad opening section, the second electrode-pad opening section being formed so as to expose the first electrode-pad opening section entirely, and the second passivation film being provided so as not to be in direct contact with the electrode pad.

With this structure, the second electrode-pad opening section of the second passivation film is formed so that the first electrode-pad opening section is exposed entirely. Thus, the second passivation film, which is low in adhesion, is not in direct contact with the electrode pad.

Therefore, an upper layer of the electrode pad is stabilized, so that adhesion of the metal film, which constitutes the external connection terminal, and the electrode pad improves.

This prevents peeling-off and cracking at the interface between the metal film and the electrode pad. Therefore, a semiconductor device having suitable electric characteristics is realized.

Further, as described above, a method for manufacturing a semiconductor device, provided with a semiconductor chip wherein an electrode pad is formed on a circuit formation surface, includes the steps of: forming, on the circuit mounting surface, a first passivation film, which serves as an adhesive layer, with a first electrode-pad opening section from which the electrode pad is to be exposed; forming, on the first passivation film, a second passivation film, which protects the semiconductor chip from external physical damage, with a second electrode-pad opening section from which the electrode pad is to be exposed; and forming an external connection terminal which connects the electrode pad to an external equipment, the external connection terminal including a metal film formed so as to cover at least the first electrode-pad opening section, the second electrode-pad opening section being formed so as to expose the first electrode-pad opening section entirely, and the second passivation film being provided so as not to be in direct contact with the electrode pad.

With this method, the second electrode-pad opening section of the second passivation film is formed so that the first electrode-pad opening section is exposed entirely. Thus, the second passivation film, which is low in adhesion, is not in direct contact with the electrode pad.

Therefore, an upper layer of the electrode pad is stabilized, so that adhesion of the metal film, which constitutes the external connection terminal, and the electrode pad improves.

This prevents peeling-off and cracking at the interface between the metal film and the electrode pad. Therefore, a semiconductor device having suitable electric characteristics is realized.

INDUSTRIAL APPLICABILITY

The present technology is suitable and applicable to a semiconductor device bonded to a substrate of an electronic device by flip-chip.

The embodiments and concrete examples of implementation discussed in the foregoing detailed explanation serve solely to illustrate the technical details, which should not be narrowly interpreted within the limits of such embodiments and concrete examples, but rather may be applied in many variations within the spirit of the present technology, provided such variations do not exceed the scope of the patent claims set forth below.

What is claimed is:

1. A semiconductor device provided with a semiconductor chip wherein an electrode pad is formed on a circuit formation surface, said semiconductor device comprising:
   a first passivation film, which serves as an adhesive layer, formed on the circuit formation surface, with a first electrode-pad opening section from which the electrode pad is to be exposed;
   a second passivation film, which protects said semiconductor chip from external physical damage, formed on said first passivation film, with a second electrode-pad opening section from which said electrode pad is to be exposed; and
   an external connection terminal which connects the electrode pad to an external equipment, said external connection terminal including a metal film having rounded side edges said metal film being formed so as to cover at least the first electrode-pad opening section, said second electrode-pad opening section being formed so as to expose said first electrode-pad opening section entirely, and said second passivation film being provided so as not to be in direct contact with said electrode pad.

2. The semiconductor device of claim 1, wherein:
   said second electrode-pad opening section is formed larger than said first electrode-pad opening section so that a periphery of said second electrode-pad opening section is outside of a periphery of said first electrode-pad opening section; and
   a part of said metal film adheres to said first passivation film in an area where the second electrode-pad opening section is formed.

3. The semiconductor device of claim 1, wherein:
   said metal film has an adhesion section adhering to said first passivation film; and
   the adhesion section is formed so as to surround said first electrode-pad opening section.

4. The semiconductor device of claim 1, wherein said first passivation film is made of a material that is lower in absorption rate than said second passivation film.

5. The semiconductor device of claim 1, wherein said first passivation film is made of a material having a smaller coefficient of linear expansion than said second passivation film.

6. The semiconductor device of claim 1, wherein said first passivation film is made of an inorganic material, and said second passivation film is made of an organic material.

7. The semiconductor device of claim 1, wherein a cross section of said metal film along a laminate orientation is formed in polygonal shape in such a manner that each corner section of the polygonal shape is rounded.

8. The semiconductor device of claim 1, wherein:
   said metal film is a laminate of plural layers including a first layer, which is an uppermost layer, and a second layer, which is provided directly below the uppermost layer;
   the first layer and the second layer are made of a same metal or a material containing, as a main component, a same metal; and
   the metal of the first layer is coarser in structure than the metal of the second layer.

9. The semiconductor device of claim 8, wherein:
   the plural layers further include a third layer being a lowermost layer and a barrier layer; and
   the first layer is made of Cu and has a thickness of 2 µm or greater.

10. The semiconductor device of claim 1, wherein said external connection terminal includes a bump formed on said metal film and containing a Pb-free solder material.

11. The semiconductor device of claim 1, wherein:
    said external connection terminal includes a bump formed on said metal film and having at least a coating constituted of a conductive bonding member and a core section made of resin or metal; and
    the core section does not melt at a melting temperature of the coating.

12. The semiconductor device of claim 7, wherein the rounded corner sections of said metal film are at least partially covered by a bump material.

13. The semiconductor device of claim 7, wherein at least a portion of the rounded side edge of said metal film is covered by a bump material.

14. The semiconductor device of claim 1, wherein a side surface of said second electrode-pad opening section, in which said metal film is to be provided, inclines outwardly from a rear surface of said second passivation film toward a front surface of said second passivation film to form a curved surface contiguous to the front surface.

15. The semiconductor device of claim 1, wherein a side surface of said second electrode-pad opening section, over which said metal film is to be provided, inclines outwardly from a rear surface of said second passivation film toward a front surface of said second passivation film to form a curved surface contiguous to an adhesion surface of said first passivation film, which adhesion surface adheres to said metal film.

16. The semiconductor device of claim 1, wherein a cross section of said second electrode-pad opening section along a surface orientation is one of ellipse-shaped, round-shaped, and polygon-shaped having each corner section being rounded.

17. The semiconductor device of claim 1, wherein a side surface of said first electrode-pad opening section, in which said metal film is to be provided, inclines outwardly from a rear surface of said first passivation film toward a front surface of said first passivation film.

18. The semiconductor device of claim 1, wherein a side surface of said first electrode-pad opening section forms a curved surface contiguous to a front surface of said first passivation film.

19. The semiconductor device of claim 1, wherein a side surface of said first electrode-pad opening section forms a curved surface contiguous to an adhesion surface of said electrode pad, which adhesion surface adheres to said metal film.

20. The semiconductor device of claim 1, wherein said second electrode-pad opening section is formed substantially at a center of said metal film.

21. The semiconductor device of claim 11, wherein after a reflow process has been conducted portions of the coating of the bump are adhered to a portion of the rounded side edge of the metal film.

22. A semiconductor device provided with a semiconductor chip wherein an electrode pad is formed on a circuit formation surface of the chip, said semiconductor device comprising:
- a first passivation film, which serves as an adhesive layer, formed on the circuit formation surface, with a first electrode-pad opening section from which the electrode pad is to be exposed;
- a second passivation film, which protects said semiconductor chip from external physical damage, formed on said first passivation film, with a second electrode-pad opening section from which said electrode pad is to be exposed, wherein a periphery of at least a portion of the second electrode-pad opening section is located outside of the periphery of the electrode pad; and
- an external connection terminal which connects the electrode pad to an external equipment, said external connection terminal including a metal film formed so as to cover at least the first electrode-pad opening section.

23. The semiconductor device of claim 22, wherein said second electrode-pad opening section is formed so as to expose said first electrode-pad opening section entirely, and said second passivation film being provided so as not to be in direct contact with said electrode pad.

24. The semiconductor device of claim 22, wherein a periphery of at least a portion of said second electrode-pad opening section substantially coincides with a periphery of said first electrode-pad opening section.

25. The semiconductor device of claim 22, wherein:
- said second electrode-pad opening section is formed larger than said first electrode-pad opening section so that a periphery of said second electrode-pad opening section is outside of a periphery of said first electrode-pad opening section; and
- a part of said metal film adheres to said first passivation film in an area where the second electrode-pad opening section is formed.

26. The semiconductor device of claim 22, wherein:
- said metal film has, at least at a part of a periphery of said electrode pad, an adhesion section adhering to said first passivation film; and
- said second passivation film is formed so as to cover a part of a periphery of said electrode pad.

27. The semiconductor device of claim 22, wherein:
- said metal film includes, along an entire periphery of said electrode pad, an adhesion section adhering to said first passivation film; and
- said second passivation film is formed so as to cover a part of the periphery of said electrode pad.

28. The semiconductor device of claim 22, wherein said second electrode-pad opening section is formed so as to surround the periphery of said electrode pad.

29. The semiconductor device of claim 22, wherein a cross section of said metal film along a laminate orientation is formed in a polygonal shape in such a manner that each corner section of the polygonal shape is rounded.

30. The semiconductor device of claim 29, wherein the rounded corner sections of the polygonal shape of said metal film are at least partially covered by a bump material.

31. The semiconductor device of claim 22, wherein:
- said metal film is a laminate of plural layers including a first layer, which is an uppermost layer, and a second layer, which is provided directly below the uppermost layer;
- the first layer and the second layer are made of a same metal or a material containing, as a main component, a same metal; and
- the metal of the first layer is coarser in structure than the metal of the second layer.

32. The semiconductor device of claim 22, wherein side edges of the metal film are rounded.

33. The semiconductor device of claim 32, wherein at least a portion of the rounded side edge of the metal film is covered by a bump material.

34. The semiconductor device of claim 22, wherein a side surface of said second electrode-pad opening section forms a curved surface.

35. The semiconductor device of claim 22, wherein a side surface of said first electrode-pad opening section forms a curved surface.

36. The semiconductor device of claim 22, wherein a center of said first electrode-pad opening section is positioned so as to deviate from a center of said metal film.

* * * * *